United States Patent
Zhang et al.

(10) Patent No.: US 12,217,657 B2
(45) Date of Patent: Feb. 4, 2025

(54) LIGHT-EMITTING SUBSTRATE AND DISPLAY DEVICE

(71) Applicant: BOE TECHNOLOGY GROUP CO., LTD., Beijing (CN)

(72) Inventors: Shunhang Zhang, Beijing (CN); Kai Hou, Beijing (CN); Liwei Liu, Beijing (CN); Hongrun Wang, Beijing (CN); Hui Zhang, Beijing (CN); Changfeng Li, Beijing (CN); Yunsik Im, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/916,255

(22) PCT Filed: Apr. 1, 2021

(86) PCT No.: PCT/CN2021/085031
§ 371 (c)(1),
(2) Date: Sep. 30, 2022

(87) PCT Pub. No.: WO2022/205343
PCT Pub. Date: Oct. 6, 2022

(65) Prior Publication Data
US 2024/0212578 A1 Jun. 27, 2024

(51) Int. Cl.
*G09G 3/32* (2016.01)
*H01L 25/075* (2006.01)
(Continued)

(52) U.S. Cl.
CPC ............ *G09G 3/32* (2013.01); *H01L 25/0753* (2013.01); *H01L 27/156* (2013.01); *H01L 33/62* (2013.01);
(Continued)

(58) Field of Classification Search
CPC ............ G09G 3/32; G09G 2300/0823; G09G 2320/0233; H01L 25/0753; H01L 27/156; H01L 33/62
See application file for complete search history.

(56) References Cited

U.S. PATENT DOCUMENTS 7,726,828 B2   6/2010   Sato
9,939,680 B2   4/2018   Cho et al.
(Continued)

FOREIGN PATENT DOCUMENTS

| CN | 101375095 A | 2/2009 |
| CN | 102650383 A | 8/2012 |

(Continued)

OTHER PUBLICATIONS

International Search Report and Written Opinion Mailed Aug. 13, 2021 from China National Intellectual Property Administration (ISA/CN).
(Continued)

*Primary Examiner* — Dmitriy Bolotin
(74) *Attorney, Agent, or Firm* — Dilworth & Barrese, LLP.; Michael J. Musella, Esq.

(57) ABSTRACT

A light-emitting substrate, a display device, and an electronic apparatus are provided. The light-emitting substrate includes a base substrate, light-emitting units, and first driving signal line groups; the light-emitting unit includes light-emitting sub-units; the first driving signal line is configured to be connected to the first electrode terminal of the light-emitting sub-unit; a translation distance in the column direction is provided between a k-th light-emitting unit in the N-th column and a k-th light-emitting unit in the (N+1)-th column, and the translation distance is smaller than a spacing between two adjacent light-emitting units in a same column in the column direction; the first driving signal line group is between the N-th column of light-emitting units and
(Continued)

the (N+1)-th column of light-emitting units and alternately passes through light-emitting units in the N-th column and the (N+1)-th column; and each light-emitting unit is passed by two adjacent first driving signal line groups.

20 Claims, 7 Drawing Sheets

(51) Int. Cl.
    *H01L 27/15*     (2006.01)
    *H01L 33/62*     (2010.01)

(52) U.S. Cl.
    CPC ............... *G09G 2300/0823* (2013.01); *G09G 2320/0233* (2013.01)

(56) References Cited

U.S. PATENT DOCUMENTS

| | | | |
|---|---|---|---|
| 10,754,195 B2 | 8/2020 | Yasunaga et al. | |
| 11,522,152 B2 | 12/2022 | Xin et al. | |
| 2008/0238955 A1 | 10/2008 | Yamashita et al. | |
| 2012/0181436 A1 | 7/2012 | Mollov | |
| 2012/0218752 A1 | 8/2012 | Sumitani | |
| 2014/0361709 A1* | 12/2014 | Krijn | G09G 3/32 362/249.05 |
| 2015/0213772 A1* | 7/2015 | Tung | G09G 3/3659 345/694 |
| 2016/0360191 A1* | 12/2016 | Yang | H04N 13/383 |
| 2017/0169748 A1* | 6/2017 | Chen | G09G 3/3225 |
| 2018/0130396 A1* | 5/2018 | Zou | H10K 59/131 |
| 2018/0248123 A1 | 8/2018 | Ishisone et al. | |
| 2019/0227221 A1 | 7/2019 | Yasunga et al. | |
| 2020/0012154 A1 | 1/2020 | Watanabe et al. | |
| 2020/0312832 A1* | 10/2020 | Chi | H10K 59/131 |

FOREIGN PATENT DOCUMENTS

| | | |
|---|---|---|
| CN | 106842692 A | 6/2017 |
| CN | 110031997 A | 7/2019 |
| CN | 110068956 A | 7/2019 |
| CN | 110431479 A | 11/2019 |
| CN | 110752243 A | 2/2020 |
| CN | 111781771 A | 10/2020 |

OTHER PUBLICATIONS

India Office Action from Application No. 202347025494; Mailing date: Nov. 7, 2023.

Extended European Search Report from Application No. 21934001.5; Mailing date: Dec. 1, 2023.

* cited by examiner

LIGHT-EMITTING SUBSTRATE AND DISPLAY DEVICE

TECHNICAL FIELD

Embodiments of the present disclosure relate to a light-emitting substrate and a display device.

BACKGROUND

With the development of light-emitting diode technology, the backlight using the submillimeter or even micron light-emitting diode has been widely used. Thus, not only the image contrast of such as a transmission display product using the backlight can reach the level of the organic light-emitting diode (OLED) display product, but also the product can retain the technical advantages of the liquid crystal display (LCD), so as to improve the display effect of the image and provide users with better visual experience.

SUMMARY

At least an embodiment of the present disclosure provides a light-emitting substrate, and the light-emitting substrate comprises a base substrate and further comprises a plurality of light-emitting units and a plurality of first driving signal line groups on the base substrate; each of the light-emitting units comprises a plurality of light-emitting sub-units, and each of the light-emitting sub-units comprises a first electrode terminal and a second electrode terminal, a polarity of the second electrode terminal being opposite to a polarity of the first electrode terminal; each of the first driving signal line groups comprises at least one first driving signal line, and the first driving signal line is configured to be connected to the first electrode terminal of the light-emitting sub-unit to provide a first electrode signal; the plurality of light-emitting units are arranged in a plurality of columns and a plurality of rows along a row direction and a column direction, respectively; among an N-th column of light-emitting units and an (N+1)-th column of light-emitting units, a translation distance, in the column direction, is provided between a k-th light-emitting unit in the N-th column of light-emitting units and a k-th light-emitting unit in the (N+1)-th column of light-emitting units, and the translation distance is smaller than a spacing between two adjacent light-emitting units in a same column in the column direction, so as to allow light-emitting units in the N-th column and the (N+1)-th column to be respectively located in different rows in sequence, where N and k are positive integers greater than 0; the first driving signal line group is between the N-th column of light-emitting units and the (N+1)-th column of light-emitting units, and the first driving signal line group is in a zigzag extension along the column direction and alternately passes through a light-emitting unit of an M-th row and the N-th column, a light-emitting unit of an (M+1)-th row and the (N+1)-th column, and a light-emitting unit of an (M+2)-th row and the N-th column, so as to provide the first electrode signal to the light-emitting units in the N-th column and the (N+1)-th column, where M is a positive integer greater than 0; and each of the light-emitting units is passed by two adjacent first driving signal line groups.

For example, in the light-emitting substrate provided by an embodiment of the present disclosure, between the N-th column of light-emitting units and the (N+1)-th column of light-emitting units, the first driving signal line group extends substantially along a straight line between two light-emitting units in two adjacent rows.

For example, in the light-emitting substrate provided by an embodiment of the present disclosure, the translation distance is equal to ½ of the spacing between two adjacent light-emitting units in the same column in the column direction; and between the N-th column of light-emitting units and the (N+1)-th column of light-emitting units, an included angle of an extending direction of the first driving signal line group between the light-emitting unit of the M-th row and the N-th column and the light-emitting unit of the (M+1)-th row and the (N+1)-th column with respect to the row direction is equal to an included angle of an extending direction of the first driving signal line group between the light-emitting unit of the (M+1)-th row and the (N+1)-th column and the light-emitting unit of the (M+2)-th row and the N-th column with respect to the row direction.

For example, in the light-emitting substrate provided by an embodiment of the present disclosure, between the N-th column of light-emitting units and the (N+1)-th column of light-emitting units, the first driving signal line group at least partially overlaps with each light-emitting unit in the N-th column and the (N+1)-th column in a direction perpendicular to the base substrate, so as to alternately pass through each light-emitting unit in the N-th column and the (N+1)-th column.

For example, in the light-emitting substrate provided by an embodiment of the present disclosure, the plurality of light-emitting sub-units in each of the light-emitting units comprise a first light-emitting sub-unit and a second light-emitting sub-unit, and the first light-emitting sub-unit and the second light-emitting sub-unit are arranged adjacent to each other in the row direction; the at least one first driving signal line in each of the first driving signal line groups comprises a first light-emitting signal line corresponding to the first light-emitting sub-unit and a second light-emitting signal line corresponding to the second light-emitting sub-unit, the first light-emitting signal line is configured to be connected to the first electrode terminal of the first light-emitting sub-unit to provide a first electrode signal corresponding to the first light-emitting sub-unit, and the second light-emitting signal line is configured to be connected to the first electrode terminal of the second light-emitting sub-unit to provide a first electrode signal corresponding to the second light-emitting sub-unit; and between the N-th column of light-emitting units and the (N+1)-th column of light-emitting units, the first light-emitting signal line in the first driving signal line group is connected to the first light-emitting sub-unit in each of the light-emitting units in the N-th column, and the second light-emitting signal line in the first driving signal line group is connected to the second light-emitting sub-unit in each of the light-emitting units in the (N+1)-th column.

For example, in the light-emitting substrate provided by an embodiment of the present disclosure, in each of the first driving signal line groups, the first light-emitting signal line and the second light-emitting signal line are sequentially arranged in the row direction from the second light-emitting sub-unit to the first light-emitting sub-unit in each of the light-emitting units.

For example, in the light-emitting substrate provided by an embodiment of the present disclosure, between the (N+1)-th column of light-emitting units and the (N+2)-th column of light-emitting units, the first light-emitting signal line in the first driving signal line group is connected to the first light-emitting sub-unit in each of the light-emitting units in the (N+1)-th column, and the second light-emitting signal line in the first driving signal line group is connected to the second light-emitting sub-unit in each of the light-emitting units in the (N+2)-th column.

For example, in the light-emitting substrate provided by an embodiment of the present disclosure, the plurality of light-emitting sub-units in each of the light-emitting units further comprise a third light-emitting sub-unit, and the third light-emitting sub-unit is arranged side by side with the first light-emitting sub-unit and the second light-emitting sub-unit in the column direction; the at least one first driving signal line in each of the first driving signal line groups further comprises a third light-emitting signal line corresponding to the third light-emitting sub-unit, and the third light-emitting signal line is configured to be connected to the first electrode terminal of the third light-emitting sub-unit to provide a first electrode signal corresponding to the third light-emitting sub-unit; and between the N-th column of light-emitting units and the (N+1)-th column of light-emitting units, the third light-emitting signal line in the first driving signal line group is connected to the third light-emitting sub-unit in each light-emitting unit in the N-th column or connected to the third light-emitting sub-unit in each light-emitting unit in the (N+1)-th column.

For example, in the light-emitting substrate provided by an embodiment of the present disclosure, between the N-th column of light-emitting units and the (N+1)-th column of light-emitting units, the third light-emitting signal line in the first driving signal line group is connected to the third light-emitting sub-unit in each light-emitting unit in the (N+1)-th column; and between the (N+1)-th column of light-emitting units and the (N+2)-th column of light-emitting units, the third light-emitting signal line in the first driving signal line group is connected to the third light-emitting sub-unit in each light-emitting unit in the (N+2)-th column.

For example, in the light-emitting substrate provided by an embodiment of the present disclosure, the second light-emitting sub-unit, the third light-emitting sub-unit, and the first light-emitting sub-unit are sequentially arranged in the row direction, and in each of the first driving signal line groups, the first light-emitting signal line, the second light-emitting signal line, and the third light-emitting signal line are sequentially arranged in the row direction from the second light-emitting sub-unit to the first light-emitting sub-unit in each of the light-emitting units.

For example, in the light-emitting substrate provided by an embodiment of the present disclosure, the first light-emitting sub-unit, the second light-emitting sub-unit, and the third light-emitting sub-unit are configured to provide light of different colors respectively.

For example, the light-emitting substrate provided by an embodiment of the present disclosure further comprises a plurality of second driving signal line groups; the plurality of second driving signal line groups respectively extend along the row direction and correspond to the plurality of rows of light-emitting units one by one; and each of the second driving signal line groups comprises at least one second driving signal line, and the second driving signal line is configured to be connected to the second electrode terminal of the light-emitting sub-unit to provide a second electrode signal.

For example, in the light-emitting substrate provided by an embodiment of the present disclosure, the at least one second driving signal line in each of the second driving signal line groups comprises a fourth light-emitting signal line corresponding to the third light-emitting sub-unit and a fifth light-emitting signal line corresponding to the first light-emitting sub-unit, the fourth light-emitting signal line is configured to be connected to the second electrode terminal of the third light-emitting sub-unit to provide a second electrode signal corresponding to the third light-emitting sub-unit, and the fifth light-emitting signal line is configured to be connected to the second electrode terminal of the first light-emitting sub-unit to provide a second electrode signal corresponding to the first light-emitting sub-unit.

For example, in the light-emitting substrate provided by an embodiment of the present disclosure, the at least one second driving signal line in each of the second driving signal line groups further comprises a sixth light-emitting signal line corresponding to the second light-emitting sub-unit, the sixth light-emitting signal line is configured to be connected to the second electrode terminal of the second light-emitting sub-unit to provide a second electrode signal corresponding to the second light-emitting sub-unit, and in each of the second driving signal line groups, the sixth light-emitting signal line is between the fourth light-emitting signal line and the fifth light-emitting signal line in the column direction.

For example, in the light-emitting substrate provided by an embodiment of the present disclosure, in each of the second driving signal line groups, the sixth light-emitting signal line is connected to the fifth light-emitting signal line through a connection portion between the sixth light-emitting signal line and the fifth light-emitting signal line, and the fifth light-emitting signal line, the sixth light-emitting signal line, and the connection portion are integrally provided.

For example, in the light-emitting substrate provided by an embodiment of the present disclosure, each of the second driving signal line groups further comprises a plurality of groups of conductive portions in one-to-one correspondence with light-emitting units in one row, and each group of the conductive portions comprises a first conductive portion and a second conductive portion; the first conductive portion is connected to the fourth light-emitting signal line and extends from the fourth light-emitting signal line toward a side close to a third light-emitting sub-unit in a light-emitting unit corresponding to the first conductive portion, so as to allow an orthographic projection of the first conductive portion on the base substrate to at least partially overlap with an orthographic projection of the third light-emitting sub-unit in the corresponding light-emitting unit on the base substrate; and the second conductive portion is connected to the fifth light-emitting signal line and extends from the fifth light-emitting signal line toward a side close to a first light-emitting sub-unit in a light-emitting unit corresponding to the second conductive portion, so as to allow an orthographic projection of the second conductive portion on the base substrate to at least partially overlap with an orthographic projection of the first light-emitting sub-unit in the corresponding light-emitting unit on the base substrate.

For example, the light-emitting substrate provided by an embodiment of the present disclosure further comprises a plurality of conductive structures in one-to-one correspondence with the plurality of light-emitting units; an orthographic projection of each of the light-emitting units on the base substrate is within a region surrounded by an outer contour of an orthographic projection of a corresponding conductive structure on the base substrate; and along a direction from a center to an edge of each of the conductive structures, each conductive structure is divided into a plurality of regions, and light transmittance of each of the regions of the each conductive structure is different from each other.

For example, in the light-emitting substrate provided by an embodiment of the present disclosure, shapes of orthographic projections of the conductive structures on the base substrate are substantially identical, and the orthographic projections of the conductive structures on the base substrate do not overlap with each other.

For example, in the light-emitting substrate provided by an embodiment of the present disclosure, along the direction from the center to the edge of each of the conductive structures, the light transmittance of each of the regions of the each conductive structure gradually increases.

For example, in the light-emitting substrate provided by an embodiment of the present disclosure, each of the conductive structures is a centrosymmetric structure.

For example, in the light-emitting substrate provided by an embodiment of the present disclosure, each of the conductive structures comprises a first conductive sub-structure and a second conductive sub-structure which are opposite to each other in the column direction; the first conductive sub-structure and the second conductive sub-structure are axially symmetric with respect to a center of the conductive structure along the row direction to form the conductive structure; the first conductive sub-structure and the second conductive sub-structure are separated and insulated from each other; and an orthographic projection of the first conductive sub-structure on the base substrate is on a side of an orthographic projection of the fourth light-emitting signal line on the base substrate away from an orthographic projection of the fifth light-emitting signal line on the base substrate, and an orthographic projection of the second conductive sub-structure on the base substrate is on a side of the orthographic projection of the fifth light-emitting signal line on the base substrate away from the orthographic projection of the fourth light-emitting signal line on the base substrate.

For example, in the light-emitting substrate provided by an embodiment of the present disclosure, the first conductive sub-structure is connected to the fourth light-emitting signal line, and the second conductive sub-structure is connected to the fifth light-emitting signal line.

For example, in the light-emitting substrate provided by an embodiment of the present disclosure, the first conductive sub-structure is integrally provided with the fourth light-emitting signal line, and the second conductive sub-structure is integrally provided with the fifth light-emitting signal line.

For example, in the light-emitting substrate provided by an embodiment of the present disclosure, the first conductive sub-structure comprises a plurality of first semi-annular portions arranged in sequence along the direction from the center to the edge of each of the conductive structures, and both ends of each of the first semi-annular portions are respectively connected to the fourth light-emitting signal line, so as to allow two adjacent first semi-annular portions to be electrically connected to each other and form an opening region; among the plurality of first semi-annular portions, a distance between two adjacent first semi-annular portions in different regions of each of the conductive structures gradually increases along the direction from the center to the edge of each of the conductive structures; the second conductive sub-structure comprises a plurality of second semi-annular portions arranged in sequence along the direction from the center to the edge of each of the conductive structures, and both ends of each of the second semi-annular portions are respectively connected to the fifth light-emitting signal line, so as to allow two adjacent second semi-annular portions to be electrically connected to each other and form an opening region; and among the plurality of second semi-annular portions, a distance between two adjacent second semi-annular portions in different regions of each of the conductive structures gradually increases along the direction from the center to the edge of each of the conductive structures.

For example, in the light-emitting substrate provided by an embodiment of the present disclosure, a distance in the row direction between an orthographic projection of the N-th column of light-emitting units on the base substrate and an orthographic projection of the (N+1)-th column of light-emitting units on the base substrate is greater than 0.

For example, in the light-emitting substrate provided by an embodiment of the present disclosure, a distance in the row direction between orthographic projections of two adjacent columns of light-emitting units on the base substrate is equal to a distance in the column direction between orthographic projections of two adjacent rows of light-emitting units on the base substrate.

For example, in the light-emitting substrate provided by an embodiment of the present disclosure, each first driving signal line in the first driving signal line group is connected to the first electrode terminal of one light-emitting sub-unit in the light-emitting unit passed by the first driving signal line group.

At least an embodiment of the present disclosure further provides a display device, and the display device comprises a display panel and the light-emitting substrate according to any one of the embodiments of the present disclosure; and the display panel comprises a display side and a non-display side, the light-emitting substrate is arranged on the non-display side of the display panel, and the plurality of light-emitting units and the plurality of first driving signal line groups are on a side of the base substrate away from the display panel.

For example, the display device provided by an embodiment of the present disclosure further comprises a reflective layer, and the reflective layer is on a side of the light-emitting substrate away from the display panel.

At least an embodiment of the present disclosure further provides an electronic apparatus, and the electronic apparatus comprises the display device according to any one of the embodiments of the present disclosure.

BRIEF DESCRIPTION OF THE DRAWINGS

In order to clearly illustrate the technical solutions of the embodiments of the present disclosure, the drawings of the embodiments will be briefly described in the following. It is obvious that the described drawings are only related to some embodiments of the present disclosure and thus are not limitative to the present disclosure.

DETAILED DESCRIPTION

Figure 1:
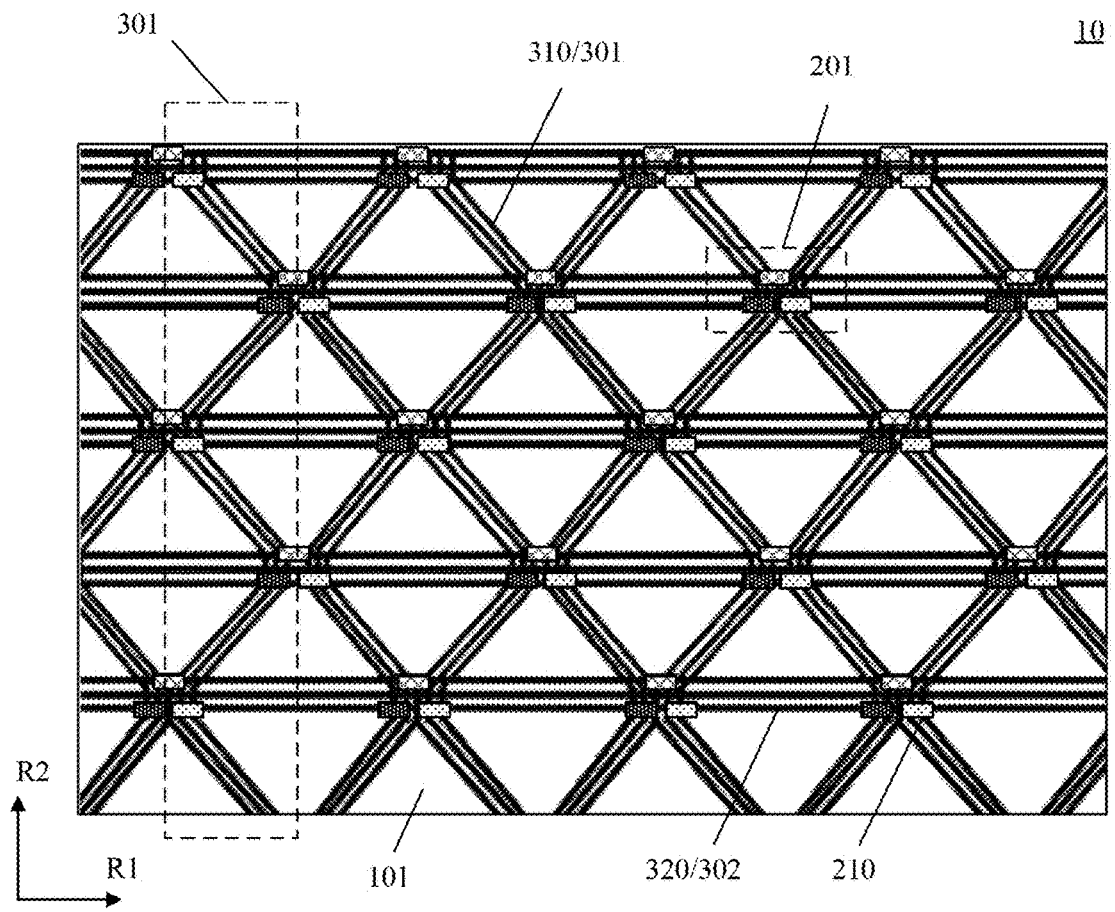
FIG. 1 is a schematic planar diagram of a light-emitting substrate provided by some embodiments of the present disclosure.

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect," "connected," "coupled," etc., are not intended to define a physical connection or mechanical connection, but may include an electrical connection, directly or indirectly. "On," "under," "right," "left," and the like are only used to indicate relative position relationship, and when the position of the object which is described is changed, the relative position relationship may be changed accordingly.

In the display product using light-emitting diodes, mini light-emitting diodes (Mini LEDs) or micro light-emitting diodes (micro LEDs) have small size and high brightness, and for example, can be widely used in the backlight module of the display product and perform fine adjustment for the backlight, thereby achieving the display of high dynamic range (HDR) images. For example, the typical size of a micro LED is equal to or less than 50 microns, such as 10 microns to 50 microns; and the typical size of a mini LED ranges from 50 microns to 150 microns, for example, from 80 microns to 120 microns. The backlight module including the above-mentioned mini light-emitting diodes or micro light-emitting diodes may be arranged on a non-display side of the display element in the display product, and the mini light-emitting diodes or micro light-emitting diodes in the backlight module may directly face the display element to emit light, so as to form a top light-emitting structure. Alternatively, for example, the mini light-emitting diodes or micro light-emitting diodes in the backlight module may also emit light towards a side away from the display element, and the light emitted by the mini light-emitting diodes or micro light-emitting diodes may be reflected to the display element by a structure with reflective functions, such as a reflective layer, thereby forming a reflective (e.g., downward light-emitting) light-emitting structure.

However, in the display product adopting the reflective light-emitting structure and being formed by mini light-emitting diodes or micro light-emitting diodes, due to the addition of structures such as a reflective layer, the diffusion film structure with a relatively large thickness in the display product is usually removed to reduce the overall thickness of the display product and achieve ultra-thin display. However, due to the removal of the diffusion film structure in the display product, the light emitted by mini light-emitting diodes or micro light-emitting diodes is difficult to be dispersed well, which leads to poor uniformity of the light provided by the whole backlight module to the display element, resulting in optical defects, which may have a seriously adverse impact on the display effect of the display product.

At least one embodiment of the present disclosure provides a light-emitting substrate, and the light-emitting substrate includes a base substrate and further includes a plurality of light-emitting units and a plurality of first driving signal line groups on the base substrate; each of the light-emitting units includes a plurality of light-emitting sub-units, and each of the light-emitting sub-units includes a first electrode terminal and a second electrode terminal, a polarity of the second electrode terminal being opposite to a polarity of the first electrode terminal; each of the first driving signal line groups includes at least one first driving signal line, and the first driving signal line is configured to be connected to the first electrode terminal of the light-emitting sub-unit to provide a first electrode signal; the plurality of light-emitting units are arranged in a plurality of columns and a plurality of rows along a row direction and a column direction, respectively; among an N-th column of light-emitting units and an (N+1)-th column of light-emitting units, a translation distance, in the column direction, is provided between a k-th light-emitting unit in the N-th column of light-emitting units and a k-th light-emitting unit in the (N+1)-th column of light-emitting units, and the translation distance is smaller than a spacing between two adjacent light-emitting units in a same column in the column direction, so as to allow light-emitting units in the N-th column and the (N+1)-th column to be respectively located in different rows in sequence, where N and k are positive integers greater than 0; the first driving signal line group is between the N-th column of light-emitting units and the (N+1)-th column of light-emitting units, and the first driving signal line group is in a zigzag extension along the column direction and alternately passes through a light-emitting unit of an M-th row and the N-th column, a light-emitting unit of an (M+1)-th row and the (N+1)-th column, and a light-emitting unit of an (M+2)-th row and the N-th column, so as to provide the first electrode signal to the light-emitting units in the N-th column and the (N+1)-th column, where M is a positive integer greater than 0; and each of the light-emitting units is passed by two adjacent first driving signal line groups.

In the light-emitting substrate provided by the above-mentioned embodiments of the present disclosure, with regard to the N-th column and the (N+1)-th column, which are adjacent to each other, of light-emitting units, (for example, the N-th column and the (N+1)-th column of light-emitting units may be light-emitting units of any two adjacent columns, such as the light-emitting units of the first column and the second column, the light-emitting units of the second column and the third column, the light-emitting units of the third column and the fourth column, etc.), the k-th light-emitting unit in the N-th column of light-emitting units and the k-th light-emitting unit in the (N+1)-th column of light-emitting units have a translation distance in the column direction, and the translation distance is smaller than a spacing, in the column direction, between two adjacent light-emitting units in the same column, so that the light-emitting units in the two adjacent columns are in a staggered arrangement in the column direction, so as to allow the light-emitting units in the two adjacent columns to be respectively located in different rows along the column direction. Moreover, the first driving signal line group for providing the first electrode signal to the light-emitting sub-units in the light-emitting units is in a zigzag extension along the column direction between the N-th column of light-emitting units and the (N+1)-th column of light-emitting units, and the first driving signal line group alternately passes through the light-emitting unit of the M-th row and the N-th column, the light-emitting unit of the (M+1)-th row and the (N+1)-th column, and the light-emitting unit of the (M+2)-th row and the N-th column, thereby alternately passing through the light-emitting units in the two adjacent columns. Thus, each light-emitting unit or each row of light-emitting units can be passed by two adjacent first driving signal line groups, so that a plurality of first driving signal line groups which extend in a zigzag way along the column direction between each two adjacent columns of light-emitting units form an approximate grid-like wiring structure on the base substrate, so as to achieve the effect of uniform arrangement in the plane parallel to the main surface of the base substrate. Therefore, by using the approximate grid-like uniform arrangement design formed by the first driving signal line groups on the base substrate, the first driving signal lines in the first driving signal line group can be used to select whether the light passing through the base substrate to pass or be shielded, so as to improve the uniformity of light passing through, thereby improving the uniformity of light emitted by the light-emitting substrate, and improving the light-emitting uniformity of the whole light-emitting substrate.

Hereinafter, embodiments of the present disclosure will be described in detail with reference to the accompanying drawings. It should be noted that the same reference numerals in different drawings will be used to refer to the same elements already described.

FIG. 1 is a schematic planar diagram of a light-emitting substrate provided by some embodiments of the present disclosure. As illustrated in FIG. 1, the light-emitting substrate 10 includes a base substrate 101, and a plurality of light-emitting units 201 and a plurality of first driving signal line groups 301 located on the base substrate 101. Each light-emitting unit 201 includes a plurality of light-emitting sub-units 210, each light-emitting sub-unit 210 includes a first electrode terminal and a second electrode terminal, and a polarity of the second electrode terminal is opposite to a polarity of the first electrode terminal. For example, one of the first electrode terminal and the second electrode terminal of the light-emitting sub-unit 210 may be an anode terminal and the other is a cathode terminal. Each first driving signal line group 301 includes at least one first driving signal line 310, and the first driving signal line 310 is configured to be connected with the first electrode terminal of the light-emitting sub-unit 210 to provide a first electrode signal.

For example, the number of first driving signal lines 310 included in each first driving signal line group 301 may be equal to the number of light-emitting sub-units 210 included in each light-emitting unit 201, so that corresponding first electrode signals can be provided to different light-emitting sub-units 210 in each light-emitting unit 201 through the first driving signal lines 310. For example, taking the case illustrated in FIG. 1 as an example, each light-emitting unit 201 may include three light-emitting sub-units 210, and each first driving signal line group 301 may correspondingly include three first driving signal lines 310. It should be noted that the number of light-emitting sub-units 210 included in each light-emitting unit 201 and the number of first driving signal lines 310 included in each first driving signal line group 301 illustrated in FIG. 1 are only exemplary illustrations, and do not constitute a limitation of the present disclosure.

For example, in the light-emitting substrate 10 provided by the embodiments of the present disclosure, the first electrode terminal of the light-emitting sub-unit 210 may be an anode terminal or a cathode terminal, and correspondingly, the first electrode signal provided to the first electrode terminal of the light-emitting sub-unit 210 may be an anode signal or a cathode signal driving the light-emitting sub-unit 210 to emit light. Therefore, by connecting the first driving signal line 310 with the first electrode terminal of the light-emitting sub-unit 210, the corresponding anode signal or cathode signal can be provided to the corresponding electrode terminal of the light-emitting sub-unit 210 to drive the light-emitting sub-unit 210 to emit light. For example, in the case that the first electrode terminal of the light-emitting sub-unit 210 is the anode terminal and the second electrode terminal of the light-emitting sub-unit 210 is the cathode terminal, the first driving signal line 310 may be configured to be connected with the anode terminal (i.e., the first electrode terminal) of the light-emitting sub-unit 210 and provide an anode signal as the first electrode signal. Alternatively, in the case that the first electrode terminal of the light-emitting sub-unit 210 is the cathode terminal and the second electrode terminal of the light-emitting sub-unit 210 is the anode terminal, the first driving signal line 310 may be configured to be connected with the cathode terminal (i.e., the first electrode terminal) of the light-emitting sub-unit 210 and provide a cathode signal as the first electrode signal. The embodiments of the present disclosure are not limited in this aspect.

As illustrated in FIG. 1, light-emitting units 201 are arranged in a plurality of columns and a plurality of rows along the row direction R1 (for example, the first direction R1) and the column direction R2 (for example, the second direction R2), respectively.

Figure 2:
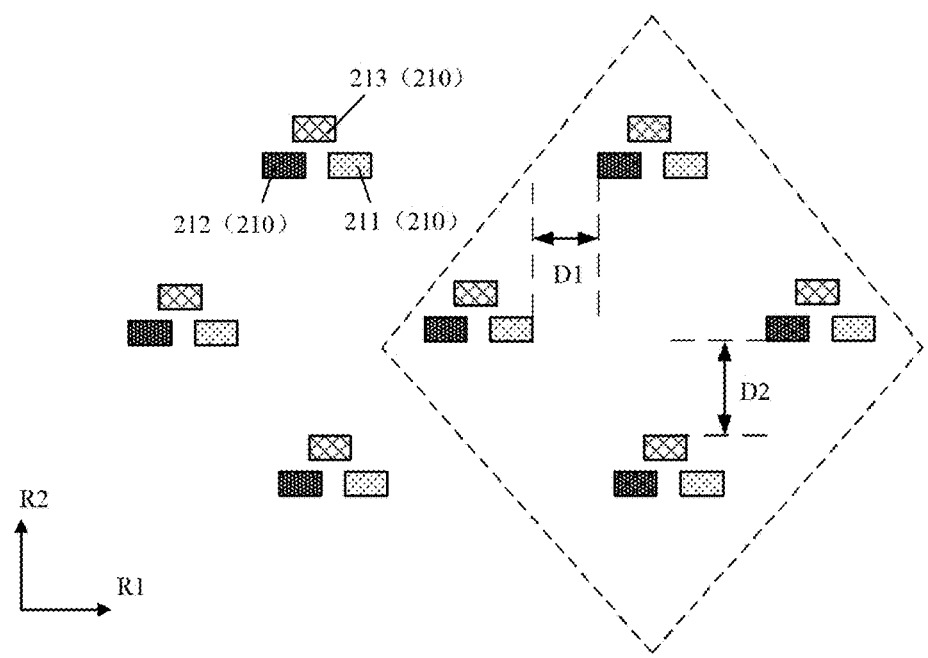
FIG. 2 is a schematic diagram of an arrangement of light-emitting units in a light-emitting substrate provided by some embodiments of the present disclosure.
Figure 3:
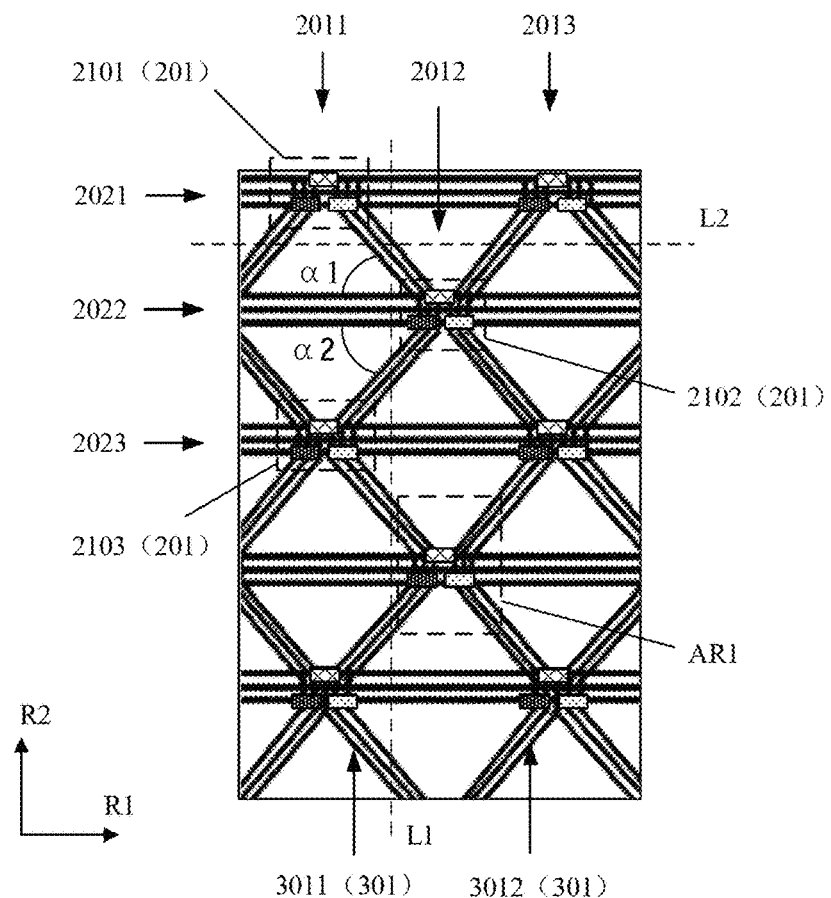
FIG. 3 is a partial planar diagram of a light-emitting substrate provided by some embodiments of the present disclosure.

In the N-th column of light-emitting units and the (N+1)-th column of light-emitting units (for example, the light-emitting units of the first column 2011 and the light-emitting units of the second column 2012, or the light-emitting units of the second column 2012 and the light-emitting units of the third column 2013 illustrated in FIG. 3), there is a translation distance (for example, the distance D2 illustrated in FIG. 2) in the column direction R2 between the k-th light-emitting unit 201 in the N-th column and the k-th light-emitting unit 201 in the (N+1)-th column, and the translation distance is smaller than the distance between two adjacent light-emitting units 201 in the same column in the column direction R2, so that the N-th column and the (N+1)-th column of light-emitting units are sequentially located in different rows, respectively, where N and k are positive integers greater than 0. For example, it may be that the k-th light-emitting unit 201 in the (N+1)-th column is located between the k-th light-emitting unit 201 in the N-th column and the (k+1)-th light-emitting unit 201 in the N-th column in the column direction R2; alternatively, it may be that the k-th light-emitting unit 201 in the N-th column is located between the k-th light-emitting unit 201 in the (N+1)-th column and the (k+1)-th light-emitting unit 201 in the (N+1)-th column in the column direction R2, so that the light-emitting units 201 in the two adjacent columns are staggered in the column direction R2, so as to allow the light-emitting units 201 in the two adjacent columns to be sequentially located in different rows along the column direction R2.

For example, as illustrated in FIG. 3, the case where the light-emitting units of the first column 2011 and the second column 2012 are respectively the light-emitting units of the N-th column and the (N+1)-th column is taken as an example, and the light-emitting units 201 in the first column 2011 and the second column 2012 are arranged in a staggered manner with respect to a reference line L1 extending along the column direction R2. For example, the light-emitting units 201 in the first column 2011 and the second column 2012 are alternately arranged at two sides of the reference line L1 along the column direction R2. For example, taking the light-emitting unit 2101 illustrated in FIG. 3 as the k-th light-emitting unit 201 in the first column 2011, and the light-emitting unit 2102 illustrated in FIG. 3 as the k-th light-emitting unit 201 in the second column 2012 as an example, the light-emitting units 2101 and 2102 have a translation distance in the column direction R2, and the translation distance is smaller than the distance between two adjacent light-emitting units 201 in the same column (for example, the light-emitting units 2101 and 2103 in the first column 2011) in the column direction R2, so that the light-emitting units 2101, 2102 and 2103 are respectively located in different rows, and thus the light-emitting units 201 in the first column 2011 and the second column 2012 are sequentially located in different rows.

For example, in the case that the light-emitting units 201 in two adjacent rows are staggered in the column direction R2, the light-emitting units 201 in two adjacent rows (such as the light-emitting units of the first row 2021 and the second row 2022, or the light-emitting units of the second row 2022 and the third row 2023 illustrated in FIG. 3) are correspondingly staggered in the row direction R1. For example, taking the light-emitting units of the first row 2021 and the second row 2022 illustrated in FIG. 3 as an example, the light-emitting units 201 in the first row 2021 and the second row 2022 are arranged in a staggered manner with respect to a reference line L2 extending along the row direction R1. For example, the light-emitting units 201 in the first row 2021 and the second row 2022 are alternately arranged on both sides of the reference line L2 along the row direction R1, so that the light-emitting units 201 in the first row 2021 and the second row 2022 are sequentially arranged in different columns.

It should be noted that only the light-emitting units 201 of some rows and columns included in the light-emitting substrate 10 are illustrated in FIG. 1, and the embodiments of the present disclosure do not limit the specific number, row number, column number, or the like of the light-emitting units 201 included in the light-emitting substrate 10. For example, in the light-emitting substrate provided by the embodiments of the present disclosure, the number of rows of light-emitting units may be less than or more than that illustrated in FIG. 1, and the number of columns of light-emitting units may be less than or more than that illustrated in FIG. 1.

For example, the first driving signal line group 301 is located between the N-th column of light-emitting units and the (N+1)-th column of light-emitting units, and the first driving signal line group 301 extends in a zigzag way along the column direction R2 and alternately passes through the light-emitting unit 201 of the M-th row and the N-th column, the light-emitting unit 201 of the (M+1)-th row and the (N+1)-th column, and the light-emitting unit 201 of the (M+2)-th row and the N-th column, so as to provide the first electrode signal to each light-emitting unit 201 in the N-th column and the (N+1)-th column, where M is an integer greater than 0.

For example, the case where the light-emitting units of the first column 2011 and the second column 2012 illustrated in FIG. 3 are respectively the light-emitting units of the N-th column and the (N+1)-th column is taken as an example, as illustrated in FIG. 1 and FIG. 3, the first driving signal line group 301 is located between the light-emitting units of the first column 2011 and the light-emitting units of the second column 2012, the second column 2012 being adjacent to the first column 2011 in the row direction R1, and the first driving signal line group 301 extends in a zigzag way along the column direction R2 and alternately passes through the light-emitting units 201 in the first column 2011 and the second column 2012, so as to provide the first electrode signal to the light-emitting units 201. For example, the light-emitting unit 2101 in the first column 2011, the light-emitting unit 2102 in the second column 2012, and the light-emitting unit 2103 in the first column 2011 illustrated in FIG. 3 may correspond to the light-emitting unit 201 of the M-th row and the N-th column, the light-emitting unit 201 of the (M+1)-th row and the (N+1)-th column, and the light-emitting unit 201 of the (M+2)-th row and the N-th column, respectively. The first driving signal line group 301 located between the light-emitting units of the first column 2011 and the light-emitting units of the second column 2012 extends in a zigzag way along the column direction R2 and alternately passes through the light-emitting units 2101, 2102 and 2103 located in different rows, thereby providing the first electrode signals to the light-emitting units 201 in the first column 2011 and the second column 2012.

For example, as illustrated in FIG. 1, each light-emitting unit 201 is passed through by two adjacent first driving signal line groups 301. It should be noted that "passing" or "passed" in the embodiments of the present disclosure may include the case where the first driving signal line 310 in the first driving signal line group 301 at least partially overlaps with the light-emitting unit 201 in the direction perpendicular to the base substrate 101, and may also include the case where the first driving signal line 310 in the first driving signal line group 301 extends to the vicinity of the light-emitting sub-unit 210 to facilitate the connection of the first driving signal line 310 with the corresponding light-emitting sub-unit 210. Overall, the first driving signal line group 301 extends in a zigzag way along the column direction R2. Locally, the first driving signal line group 301 alternately extends towards the light-emitting units 201 in the two columns to form the above zigzag-extending shape.

It should be noted that here, the first driving signal line group 301 is only described as a driving signal line group located between two adjacent columns of light-emitting units, but other forms of driving signal lines or driving signal line groups located at the edge of the light-emitting unit array are not excluded. For example, corresponding to the outermost column of light-emitting units in the row direction R1, other forms of driving signal lines or driving signal line groups may be provided to provide the first electrode signal.

It should be noted that the zigzag extension of the first driving signal line group 301 along the column direction R2 refers to the overall extending direction or overall extending shape of all the first driving signal lines 310 included in the first driving signal line group 301, that is, all the first driving signal lines 310 included in the first driving signal line group 301 extend in a zigzag way along the column direction R2. For example, the extending directions or shapes of the first driving signal lines 310 included in the first driving signal line group 301 may be the same as or different from each other.

For example, each light-emitting sub-unit 210 in each light-emitting unit 201 may be provided with the required first electrode signal through the first driving signal line 310 in two adjacent first driving signal line groups 301. For example, the first electrode signals required by the plurality of light-emitting sub-units 210 in each light-emitting unit 201 may all be provided by one first driving signal line group 301 in two adjacent first driving signal line groups 301 passing through the light-emitting unit 201, that is, provided by the first driving signal lines 310 in one first driving signal line group 301. Alternatively, the plurality of light-emitting sub-units 210 in the light-emitting unit 201 may be connected to the first driving signal lines 310 in different first driving signal line groups 301, so as to obtain the required first electrode signals.

Therefore, in the light-emitting substrate 10 provided by the embodiments of the present disclosure, while the first electrode signal is supplied to each light-emitting sub-unit 210 in the light-emitting unit 201 through the first driving signal line 310 in the first driving signal line group 301, the first driving signal line group 301 extends in a zigzag way along the column direction R2 between two adjacent columns of light-emitting units, and the plurality of first driving signal line groups 301 are used to form a grid-like uniform wiring structure in a plane parallel to a main surface of the base substrate 101, so that the first driving signal lines 310 in the first driving signal line group 301 can be used to select whether the light passing through the base substrate 101 to pass or be shielded, so as to improve the uniformity of light passing through the base substrate 101, thereby improving the uniformity of light emitted by the light-emitting substrate 10, and improving the light-emitting uniformity of the whole light-emitting substrate 10.

For example, in the embodiments illustrated in FIG. 1, each of the first driving signal lines 310 in the first driving signal line group 301 may extend in a zigzag way along the column direction R2, so that the first driving signal lines 310 in the first driving signal line group 301 are relatively uniformly arranged on the base substrate 101, thereby further improving the uniformity of the grid-like wiring structure formed by the first driving signal line group 301.

For example, in the embodiments illustrated in FIG. 1, the widths occupied by the first driving signal line groups 301 in the row direction R1 may be substantially the same as each other, and the overall shapes extending in a zigzag way along the column direction R2 may be basically consistent with each other, so as to improve the uniformity of the grid-like wiring structure formed by the plurality of first driving signal line groups 301 on the base substrate 101, and further improve the uniformity of light passing through the base substrate 101, thereby improving the uniformity of the light emitted by the light-emitting substrate 10.

For example, in the embodiments illustrated in FIG. 1, the number of first driving signal lines 310 included in each first driving signal line group 301 and the extending directions, extending shapes, widths occupied in the row direction R1, etc. of the first driving signal lines 310 may be substantially the same as each other, thereby further improving the uniformity of the grid-like wiring structure formed by the plurality of first driving signal line groups 301 on the base substrate 101.

It should be noted that in other embodiments of the present disclosure, the width occupied by each first driving signal line group 301 in the row direction R1, the extending shape of each first driving signal line group 301 in the column direction R2, and the number, size, arrangement, or the like of the first driving signal lines 310 included in each first driving signal line group 301 may also be different from each other, and the embodiments of the present disclosure are not limited in this aspect.

It should be noted that, in the embodiments of the present disclosure, the zigzag extension of the first driving signal line group 301 in the column direction R2 refers to that the whole extending direction or shape of the first driving signal line group 301 in the column direction R2 is in zigzag extension. For example, the extending directions or shapes of different parts of the first driving signal line group 301 (for example, the part of the first driving signal line group 301 between two adjacent columns of light-emitting units in the row direction R1 and between two adjacent rows of light-emitting units in the column direction R2) may extend linearly as illustrated in FIG. 1; or in other embodiments of the present disclosure, the extending directions or shapes of different parts of the first driving signal line group 301 may extend in a broken-line, curved or other suitable shapes, which are not limited by the embodiments of the present disclosure.

In some embodiments of the present disclosure, as illustrated in FIG. 1, between two adjacent columns of light-emitting units in the row direction R1, the first driving signal line group 301 extends substantially in a straight line between two light-emitting units 201 in two adjacent rows, that is, between two adjacent columns of light-emitting units in the row direction R1, and the first driving signal line group 301 extends substantially in a straight line between any two light-emitting units 201 located in different columns and adjacent in the column direction R2. For example, taking the two light-emitting units 2101 and 2102 illustrated in FIG. 3, which are located in two adjacent columns (the first column 2011 and the second column 2012) of light-emitting units in the row direction R1 and adjacent to each other in the column direction R2 (that is, located in two adjacent rows), as an example, the first driving signal line group 301 extends approximately along a straight line between the light-emitting units 2101 and 2102, for example, the first driving signal lines 310 in the first driving signal line group 301 extend approximately along a straight line. Therefore, the arrangement uniformity of the first driving signal line groups 301 and the first driving signal lines 310 in the first driving signal line groups 301 on the base substrate 101 can be improved, and the arrangement manner can be optimized, so as to facilitate forming a uniform grid-like wiring structure in the plane parallel to the main surface of the base substrate 101, and further reduce the manufacturing cost of the first driving signal lines 310, thereby improving the preparation process.

It should be noted that, in other embodiments of the present disclosure, taking the light-emitting units 2101 and 2102 as an example, the first driving signal line group 301 (for example, the first driving signal lines 310 in the first driving signal line group 301) may extend in a broken-line, curved or other suitable shape between the light-emitting units 2101 and 2102, and the embodiments of the present disclosure are not limited in this aspect.

In some embodiments of the present disclosure, for example, light-emitting units 2101, 2102 and 2103 are taken as an example, and as illustrated in FIG. 1 and FIG. 3, the translation distance between light-emitting units 2101 and 2102 (or light-emitting units 2102 and 2103) in the column direction R2 is equal to half of the spacing between two adjacent light-emitting units 201 (e.g., light-emitting units 2101 and 2103) in the same column in the column direction R2. Between the first column 2011 of light-emitting units and the second column 2012 of light-emitting units, the included angle α1 of the extending direction of the first driving signal line group 301 between the light-emitting units 2101 and 2102 relative to the row direction R1 is equal to the included angle α2 of the extending direction of the first driving signal line group 301 between the light-emitting units 2102 and 2103 relative to the row direction R1. Therefore, the arrangement uniformity of the first driving signal line groups 301 and the first driving signal lines 310 in the first driving signal line groups 301 on the base substrate 101 can be further improved, and the arrangement manner can be optimized, so as to facilitate forming a uniform grid-like wiring structure in the plane parallel to the main surface of the base substrate 101.

FIG. 2 is a schematic diagram of an arrangement of light-emitting units in a light-emitting substrate provided by some embodiments of the present disclosure.

In some embodiments of the present disclosure, as illustrated in FIG. 1 and FIG. 2, in the plurality of columns of light-emitting units arranged along the row direction R1, the distance D1 between two adjacent columns of light-emitting units in the row direction R1 is greater than 0, for example, the distance D1 between the orthographic projections of two adjacent columns of light-emitting units on the base substrate 101 in the row direction R1 is greater than 0. In the plurality of rows of light-emitting units arranged along the column direction R2, the distance D2 between two adjacent rows of light-emitting units in the column direction R2 is greater than 0, for example, the distance D2 between the orthographic projections of two adjacent rows of light-emitting units on the base substrate 101 in the column direction R2 is greater than 0. That is, among the two columns of light-emitting units adjacent in the row direction R1, the distance, in the row direction R1, between any two light-emitting units 201 located in different columns and adjacent in the column direction R2 is greater than 0, or it may also be understood that the distance between the orthographic projections of the two light-emitting units 201 on the base substrate 101 in the row direction R1 is greater than 0. In the two rows of light-emitting units adjacent in the column direction R2, the distance, in the column direction R2, between any two light-emitting units 201 located in different rows and adjacent in the row direction R1 is greater than 0, or it may also be understood that the distance, in the column direction R2, between the orthographic projections of the two light-emitting units 201 on the base substrate 101 is greater than 0. Therefore, it is possible to reduce or avoid the mutual interference or influence of light emitted from different light-emitting units 201, thereby optimizing the light-emitting effect of the light-emitting substrate 10, and it is also beneficial to the arrangement of the first driving signal line group 301 between two adjacent columns of light-emitting units.

In some embodiments of the present disclosure, as illustrated in FIG. 1 and FIG. 2, in the plurality of columns of light-emitting units arranged along the row direction R1, the distance D1 between two adjacent columns of light-emitting units in the row direction R1 may be equal to each other, that is, in the plurality of columns of light-emitting units arranged along the row direction R1, the distance D1, in the row direction R1, between the orthographic projections of two adjacent columns of light-emitting units on the base substrate 101 may be equal to each other. In the plurality of rows of light-emitting units arranged in the column direction R2, the distance D2 between two adjacent rows of light-emitting units in the column direction R2 may be equal to each other, that is, in the plurality of rows of light-emitting units arranged in the column direction R2, the distance D2 in the column direction R2 between the orthographic projections of two adjacent rows of light-emitting units on the base substrate 101 may be equal to each other. In other words, among the two columns of light-emitting units adjacent in the row direction R1, the distance D1, in the row direction R1, between the orthographic projections of any two light-emitting units 201 located in different columns and adjacent in the column direction R2 on the base substrate 101 may be equal to each other, and among the two rows of light-emitting units adjacent in the column direction R2, the distance D2, in the column direction R2, between the orthographic projections of any two light-emitting units 201 located in different rows and adjacent in the row direction R1 on the base substrate 101 may be equal to each other.

Thus, four adjacent light-emitting units 201 in the dotted-line block illustrated in FIG. 2 can approximately form a diamond-shaped structure in the plane parallel to the main surface of the base substrate 101, thereby optimizing the arrangement of light-emitting units 201 in the light-emitting substrate 10 and further improving the uniformity of the light emitted by the light-emitting substrate 10. Furthermore, as illustrated in FIG. 1 and FIG. 2, in the case where the plurality of light-emitting units 201 adopt the above arrangement, the plurality of first driving signal line groups 301 which respectively extend in a zigzag way along the column direction R2 can form a uniform grid-like wiring structure composed of a plurality of approximately diamond-shaped grids in the plane parallel to the main surface of the base substrate 101, thereby further improving the arrangement uniformity of the plurality of first driving signal line groups 301 on the base substrate 101. Thus, the uniformity of the light passing through the base substrate 101 can be further improved by the first driving signal lines 310 in the plurality of first driving signal line groups 301, thereby improving the uniformity of the light emitted by the light-emitting substrate 10 and improving the light-emitting uniformity of the whole light-emitting substrate 10.

In some embodiments of the present disclosure, among the above-mentioned plurality of light-emitting units 201 arranged in multiple rows and multiple columns, the distance D1 in the row direction R1 between the orthographic projections of two adjacent columns of light-emitting units on the base substrate 101 may be further equal to the distance D2 in the column direction R2 between the orthographic projections of two adjacent rows of light-emitting units on the base substrate 101. For example, among the plurality of light-emitting units 201, the distance between the centers of the orthographic projections of two adjacent light-emitting units 201 located in different rows and different columns on the base substrate 101 may be equal to each other. Therefore, the light-emitting units 201 which are adjacent to each other and located in different rows or different columns can approximately form an equilateral triangle structure, for example, two equilateral triangle structures can be formed between four adjacent light-emitting units 201 in the dotted-line block as illustrated in FIG. 2, thereby further optimizing the arrangement of light-emitting units 201 in the light-emitting substrate 10 and improving the uniformity of the light emitted by the light-emitting substrate 10.

In some embodiments of the present disclosure, between two adjacent columns of light-emitting units in the row direction R1, the first driving signal line group 301 at least partially overlaps with each light-emitting unit 201 in the two adjacent columns of light-emitting units in the direction perpendicular to the base substrate 101, so as to alternately pass through each light-emitting unit 201 in the two adjacent columns of light-emitting units. Therefore, the first driving signal lines 310 in the first driving signal line group 301 can be electrically connected with the corresponding light-emitting sub-units 210 in the light-emitting units 201 at the overlapping part, thereby reducing the space occupied by the conductive portions or structures for realizing the above-mentioned electrical connection in the plane parallel to the main surface of the base substrate 101 and optimizing the layout design of the first driving signal line group 301 in the light-emitting substrate 10. For example, in the light-emitting substrate 10 provided by the embodiments of the present disclosure, for example, an insulating layer or other interlayer structures may be provided between the light-emitting sub-unit 210 in the light-emitting unit 201 and the corresponding first driving signal line 310 in the first driving signal line group 301, and the electrical connection may be realized at the overlapping part by via hole design penetrating the insulating layer or other interlayer structures.

It should be noted that in the light-emitting substrate 10 illustrated in FIG. 1, the light-emitting unit 201 is drawn to cover the first driving signal line 310 in the first driving signal line group 301 in FIG. 1, but this does not constitute a limitation to the embodiments of the present disclosure. For example, in some embodiments of the present disclosure, the first driving signal line group 301 may be located on the side of the light-emitting unit 201 close to the base substrate 101. Alternatively, in other embodiments of the present disclosure, the first driving signal line group 301 may also be located on the side of the light-emitting unit 201 away from the base substrate 101, and the embodiments of the present disclosure are not limited in this aspect.

It should be noted that, in other embodiments of the present disclosure, the light-emitting unit 201 and the first driving signal line 310 in the first driving signal line group 301 may also be arranged in other suitable ways in the direction perpendicular to the base substrate 101. For example, one or more first driving signal lines 310 in the first driving signal line group 301 may also be arranged in the same layer as the light-emitting unit 201, and the embodiments of the present disclosure are not limited in this aspect.

In some embodiments of the present disclosure, each first driving signal line 310 in the first driving signal line group 301 is connected to the first electrode terminal of one light-emitting sub-unit 210 in the light-emitting unit 201 through which the first driving signal line group 301 passes, so that each first driving signal line 310 in the first driving signal line group 301 provides the first electrode signal to the corresponding light-emitting sub-unit 210.

FIG. 3 is a partial planar diagram of a light-emitting substrate provided by some embodiments of the present disclosure. In the following, the specific connection manner of the first driving signal line 310 and the light-emitting sub-unit 210 is described by taking the case where the first column 2011 of light-emitting units, the second column 2012 of light-emitting units, and the third column 2013 of light-emitting units illustrated in FIG. 3 respectively are the N-th column of light-emitting units, the (N+1)-th column of light-emitting units, and the (N+2)-th column of light-emitting units as an example, and further by combining the first signal line group 3011 (i.e., the first driving signal line group 301) between the first column 2011 of light-emitting units and the second column 2012 of light-emitting units and the second signal line group 3012 (i.e., the first driving signal line group 301) between the second column 2012 of light-emitting units and third column 2013 of light-emitting units included in the plurality of first driving signal line groups 301.

Figure 4:
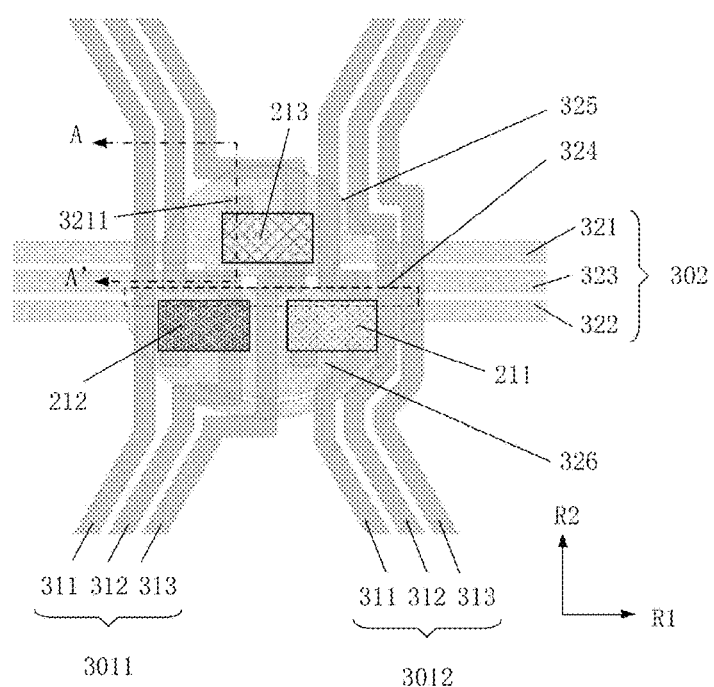
FIG. 4 is a partially enlarged schematic diagram of an example of a region AR1 illustrated in FIG. 3.

FIG. 4 is a partially enlarged schematic diagram of an example of a region AR1 illustrated in FIG. 3. It should be noted that, in some examples, the second driving signal line group 302 may include a first conductive portion 325 and a second conductive portion 326 as illustrated in FIG. 4. Alternately, in other examples, the second driving signal line group 302 may also not include the first conductive portion 325 and the second conductive portion 326 as illustrated in FIG. 4, and the embodiments of the present disclosure are not limited in this aspect.

For example, as illustrated in FIG. 1 to FIG. 4, the plurality of light-emitting units 201 include a first column 2011 of light-emitting units and a second column 2012 of light-emitting units adjacent in the row direction R1, and further include a third column 2013 of light-emitting units adjacent to the second column 2012 of light-emitting units in the row direction R1. For example, the first column 2011 of light-emitting units, the second column 2012 of light-emitting units, and the third column of light-emitting units 2013 are adjacent to each other and sequentially arranged in the row direction R1. The plurality of first driving signal line groups 301 include a first signal line group 3011 (i.e., the first driving signal line group 301) located between the first column 2011 of light-emitting units and the second column 2012 of light-emitting units adjacent in the row direction R1, and a second signal line group 3012 (i.e., the first driving signal line group 301) located between the second column 2012 of light-emitting units and the third column 2013 of light-emitting units adjacent in the row direction R1.

It should be noted that, in the embodiments of the present disclosure, "adjacent to each other and sequentially arranged" or "sequentially adjacent arrangement" may refer to that they are sequentially arranged from left to right or from right to left in the row direction R1 and are adjacent to each other in the row direction R1, or may also refer to that they are sequentially arranged from top to bottom or from bottom to top in the column direction R2 and are adjacent to each other in the column direction R2.

For example, the plurality of light-emitting sub-units 210 in each light-emitting unit 201 include a first light-emitting sub-unit 211 and a second light-emitting sub-unit 212, which are arranged adjacent to each other in the row direction R1. For example, the first light-emitting sub-unit 211 may be arranged on the right side of the second light-emitting sub-unit 212 as illustrated in FIG. 4. The first driving signal lines 310 in each first driving signal line group 301 include a first light-emitting signal line 311 (i.e., the first driving signal line 310) corresponding to the first light-emitting sub-unit 211 and a second light-emitting signal line 312 (i.e., the first driving signal line 310) corresponding to the second light-emitting sub-unit 212, the first light-emitting signal line 311 is configured to be connected with the first electrode terminal of the first light-emitting sub-unit 211 to provide the first electrode signal corresponding to the first light-emitting sub-unit 211, and the second light-emitting signal line 312 is configured to be connected with the first electrode terminal of the second light-emitting sub-unit 212 to provide the first electrode signal corresponding to the second light-emitting sub-unit 212.

It should be noted that, in the embodiments of the present disclosure, "adjacent arrangement" or "arranged adjacent" may refer to being arranged next to each other in the row direction R1 in the order from left to right or from right to left, or may also refer to being arranged next to each other in the column direction R2 in the order from top to bottom or from bottom to top.

For example, taking the first signal line group 3011 located between the first column 2011 of light-emitting units and the second column 2012 of light-emitting units adjacent in the row direction R1 as an example, as illustrated in FIG. 3 and FIG. 4, the first light-emitting signal line 311 in the first signal line group 3011 is connected with the first light-emitting sub-unit 211 in each light-emitting unit 201 of the first column 2011 of light-emitting units, and the second light-emitting signal line 312 in the first signal line group 3011 is connected with the second light-emitting sub-unit 212 in each light-emitting unit 201 of the second column 2012 of light-emitting units.

For example, taking the second signal line group 3012 located between the second column 2012 of light-emitting units and the third column 2013 of light-emitting units adjacent in the row direction R1 as an example, as illustrated in FIG. 3 and FIG. 4, the first light-emitting signal line 311 in the second signal line group 3012 is connected with the first light-emitting sub-unit 211 in each light-emitting unit 201 of the second column 2012 of light-emitting units, and the second light-emitting signal line 312 in the second signal line group 3012 is connected with the second light-emitting sub-unit 212 in each light-emitting unit 201 of the third column 2013 of light-emitting units.

Therefore, each light-emitting unit 201 in each column of light-emitting units can be provided with the required first electrode signal through two adjacent first driving signal line groups 301 passing through the light-emitting unit 201. For example, taking the second column 2012 of light-emitting units as an example, the first light-emitting unit 211 in the second column 2012 of light-emitting units can be provided with the required first electrode signal through the first light-emitting signal line 311 in the second signal line group 3012, and the second light-emitting unit 212 in the second column 2012 of light-emitting units can be provided with the required first electrode signal through the second light-emitting signal line 312 in the first signal line group 3011.

For example, as illustrated in FIG. 4, in each first driving signal line group 301, the first light-emitting signal line 311 and the second light-emitting signal line 312 are sequentially arranged along the row direction R1 from the second light-emitting sub-unit 212 to the first light-emitting sub-unit 211 in each light-emitting unit 201. For example, taking the arrangement order of the first light-emitting sub-unit 211 and the second light-emitting sub-unit 212 illustrated in FIG. 4 as an example, the first light-emitting signal line 311 and the second light-emitting signal line 312 are sequentially arranged along the row direction R1 from left to right.

It should be noted that, in the embodiments of the present disclosure, "sequentially arranged" may refer to sequential arrangement from left to right or from right to left in the row direction R1, or may also refer to sequential arrangement from top to bottom or from bottom to top in the column direction R2.

For example, the plurality of light-emitting sub-units 210 in each light-emitting unit 201 further include a third light-emitting sub-unit 213, which is arranged side by side with the first light-emitting sub-unit 211 and the second light-emitting sub-unit 212 in the column direction R2. For example, as illustrated in FIG. 4, the first light-emitting sub-unit 211, the second light-emitting sub-unit 212, and the third light-emitting sub-unit 213 are respectively arranged in two rows, the first light-emitting sub-unit 211 and the second light-emitting sub-unit 212 are located in the same row, and the third light-emitting sub-unit 213 is located above the first light-emitting sub-unit 211 and the second light-emitting sub-unit 212. The first driving signal lines 310 in each first driving signal line group 301 further include a third light-emitting signal line 313 corresponding to the third light-emitting sub-unit 213, and the third light-emitting signal line 313 is configured to be connected with the first electrode terminal of the third light-emitting sub-unit 213 to provide the first electrode signal corresponding to the third light-emitting sub-unit 213.

It should be noted that, in the embodiments of the present disclosure, "side by side arrangement" or "arranged side by side" may refer to sequential arrangement in the row direction R1 from left to right or from right to let. For example, in the case that the two are arranged side by side in the row direction R1, one of them may be located on the left or right side of the other. Alternatively, "side by side arrangement" or "arranged side by side" may also refer to sequential arrangement in the column direction R2 from top to bottom or from bottom to top. For example, in the case that the two are arranged side by side in the column direction R2, one of them may be located above or below the other.

For example, the case where the first signal line group 3011 between the first column 2011 of light-emitting units and the second column 2012 of light-emitting units adjacent in the row direction R1 and the second signal line group 3012 between the second column 2012 of light-emitting units and the third column 2013 of light-emitting units adjacent in the row direction R1 is taken as an example. The third light-emitting signal line 313 in the first signal line group 3011 is connected with the third light-emitting sub-unit 213 in each light-emitting unit 201 of the second column 2012 of light-emitting units, and the third light-emitting signal line 313 in the second signal line group 3012 is connected with the third light-emitting sub-unit 213 in each light-emitting unit 201 of the third column 2013 of light-emitting units.

Therefore, each light-emitting unit 201 in each column of light-emitting units can be provided with the required first electrode signal through two adjacent first driving signal line groups 301 passing through the light-emitting unit 201. For example, taking the second column 2012 of light-emitting units as an example, the first light-emitting unit 211 in the second column 2012 of light-emitting units can be provided with the required first electrode signal through the first light-emitting signal line 311 in the second signal line group 3012, the second light-emitting unit 212 in the second column 2012 of light-emitting units can be provided with the required first electrode signal through the second light-emitting signal line 312 in the first signal line group 3011, and the third light-emitting unit 213 in the second column 2012 of light-emitting units can be provided with the required first electrode signal through the third light-emitting signal line 313 in the first signal line group 3011.

For example, in other embodiments of the present disclosure, the third light-emitting signal line 313 in the first signal line group 3011 may be connected to the third light-emitting sub-unit 213 in each light-emitting unit 201 in the first column 2011 of light-emitting units, and the third light-emitting signal line 313 in the second signal line group 3012 may be connected to the third light-emitting sub-unit 213 in each light-emitting unit 201 in the second column 2012 of light-emitting units.

In other words, taking the light-emitting unit 201 illustrated in FIG. 3 and FIG. 4 as an example, for each light-emitting sub-unit 210 in the light-emitting unit 201, that is, the first light-emitting sub-unit 211, the second light-emitting sub-unit 212, and the third light-emitting sub-unit 213, among the two first driving signal line groups 301 passing through the light-emitting unit 201, the third light-emitting signal line 313 corresponding to the third light-emitting sub-unit 213 and the first light-emitting signal line 311 corresponding to the first light-emitting sub-unit 211 may belong to one of the first driving signal line groups 301, while the second light-emitting signal line 312 corresponding to the second light-emitting sub-unit 212 may belong to the other of the first driving signal line groups 301. Alternatively, the third light-emitting signal line 313 corresponding to the third light-emitting sub-unit 213 and the second light-emitting signal line 312 corresponding to the second light-emitting sub-unit 212 may belong to one of the first driving signal line groups 301, and the first light-emitting signal line 311 corresponding to the first light-emitting sub-unit 211 may belong to the other of the first driving signal line groups 301. The embodiments of the present disclosure are not limited in this aspect.

For example, the second light-emitting sub-unit 212, the third light-emitting sub-unit 213, and the first light-emitting sub-unit 211 are sequentially arranged in the row direction R1. For example, as illustrated in FIG. 4, the center of the second light-emitting sub-unit 212, the center of the third light-emitting sub-unit 213, and the center of the first light-emitting sub-unit 211 are sequentially arranged from left to right in the row direction R1. In each first driving signal line group 301 (for example, the first signal line group 3011 and the second signal line group 3012 illustrated in FIG. 4), the first light-emitting signal line 311, the second light-emitting signal line 312, and the third light-emitting signal line 313 are sequentially arranged along the row direction R1 in the direction from the second light-emitting sub-unit 212 to the first light-emitting sub-unit 211 in each light-emitting unit 201. For example, as illustrated in FIG. 4, the first light-emitting signal line 311, the second light-emitting signal line 312, and the third light-emitting signal line 313 are sequentially arranged along the row direction R1 from left to right.

It should be noted that, in the embodiments of the present disclosure, "sequentially arranged" may refer to being sequentially arranged from left to right or from right to left in the row direction R1, or may also refer to being sequentially arranged from top to bottom or from bottom to top in the column direction R2.

It should be noted that in other embodiments of the present disclosure, each light-emitting unit 201 may also include fewer or more light-emitting sub-units 210, and the light-emitting sub-units 210 in each light-emitting unit 201 may also adopt other suitable arrangements, which are not limited by the embodiments of the present disclosure.

It should be noted that, in the embodiments of the present disclosure, the above-mentioned connection manner of the first driving signal line 310 in the first driving signal line group 301 located between two adjacent columns of light-emitting units and each light-emitting sub-unit 210 in the two adjacent columns of light-emitting units, and the above-mentioned arrangement order in the row direction R1 are only exemplary illustrations, and the embodiments of the present disclosure are not limited in this aspect.

In some embodiments of the present disclosure, the first light-emitting sub-unit 211, the second light-emitting sub-unit 212, and the third light-emitting sub-unit 213 may be configured to provide light of different colors, respectively. For example, the first light-emitting sub-unit 211, the second light-emitting sub-unit 212, and the third light-emitting sub-unit 213 may be configured to provide blue light, green light, and red light, respectively. Alternatively, in some embodiments of the present disclosure, the first light-emitting sub-unit 211, the second light-emitting sub-unit 212, and the third light-emitting sub-unit 213 may be respectively configured to provide light of other different colors, and the embodiments of the present disclosure are not limited in this aspect. Alternatively, in some embodiments of the present disclosure, the first light-emitting sub-unit 211, the second light-emitting sub-unit 212, and the third light-emitting sub-unit 213 may also be configured to provide light of the same color. For example, in this case, a color filter structure such as a color film layer may be included in the light-emitting substrate 10 to achieve providing light of different colors. The embodiments of the present disclosure do not limit the specific color of light provided by each light-emitting sub-unit 210 in the light-emitting unit 201.

For example, the width of the first driving signal line 310 in the first driving signal line group 301 in the row direction R1 may range from 40 μm to 60 μm, that is, the widths of the first light-emitting signal line 311, the second light-emitting signal line 312, and the third light-emitting signal line 313 in the first driving signal line group 301 in the row direction R1 may range from 40 μm to 60 μm, further for example, 40 μm, 45 μm, 50 μm, 55 μm, 60 μm, or the like. In each first driving signal line group 301, the spacing between the first light-emitting signal line 311 and the second light-emitting signal line 312 in the row direction R1, or the spacing between the third light-emitting signal line 313 and the second light-emitting signal line 312 in the row direction R1 may be, for example, 10 μm to 30 μm, and further, for example, 10 μm, 15 μm, 20 μm, 25 μm, 30 μm, etc.

For example, as illustrated in FIG. 4, the first light-emitting signal line 311, the second light-emitting signal line 312, and the third light-emitting signal line 313 may be arranged around and close to the positions of the first light-emitting sub-unit 211, the second light-emitting sub-unit 212, and the third light-emitting sub-unit 213 as much as possible. Therefore, the first light-emitting signal line 311, the second light-emitting signal line 312, and the third light-emitting signal line 313 can be used at the positions close to the first light-emitting sub-unit 211, the second light-emitting sub-unit 212, and the third light-emitting sub-unit 213 to better play the role of light shielding, so as to improve the uniformity of light passing through the whole light-emitting substrate 10, and further improve the uniformity of the light emitted by the light-emitting substrate 10. For example, as illustrated in FIG. 4, the bending angle between the first light-emitting signal line 311 (the second light-emitting signal line 312, or the third light-emitting signal line 313) and the row direction R1 may be about 60 degrees, thereby reducing the area of possible irregular wiring, and reducing or avoiding the adverse influence on the uniformity of the grid-like wiring structure formed by the plurality of first driving signal line groups 301.

For example, in some embodiments of the present disclosure, as illustrated in FIG. 1 to FIG. 5, the light-emitting substrate 10 further includes a plurality of second driving signal line groups 302. The plurality of second driving signal line groups 302 respectively extend along the row direction R1 and correspond to a plurality of rows of light-emitting units one by one, each second driving signal line group 302 includes at least one second driving signal line 320, and the second driving signal line 320 is configured to be connected with the second electrode terminal of the light-emitting sub-unit 210 to provide a second electrode signal.

For example, the first electrode signal and the second electrode signal may be an anode signal and a cathode signal that drive the light-emitting sub-unit 210 to emit light, respectively. For example, the first electrode signal provided by the first driving signal line 310 may be a cathode signal, and the second electrode signal provided by the second driving signal line 320 may be an anode signal. Alternatively, the first electrode signal provided by the first driving signal line 310 may be an anode signal, and the second electrode signal provided by the second driving signal line 320 may be a cathode signal. The embodiments of the present disclosure are not limited in this aspect.

For example, in the embodiments illustrated in FIG. 1, the number of second driving signal lines 320 included in each second driving signal line group 302 may be the same as the number of first driving signal lines 310 included in each first driving signal line group 301, that is, the same as the number of light-emitting sub-units 210 included in each light-emitting unit 201. Therefore, the corresponding second electrode signals can be provided to different light-emitting sub-units 210 in each light-emitting unit 201 through the second driving signal lines 320, the first driving signal lines 310 in the first driving signal line group 301 and the second driving signal lines 320 in the second driving signal line group 302 can be arranged relatively uniformly on the base substrate 101, and the first driving signal line group 301 and the second driving signal line group 302 can be used to form a uniform grid-like wiring structure on the base substrate 101. Thus, the first driving signal lines 310 in the first driving signal line group 301 and the second driving signal lines 320 in the second driving signal line group 302 can be used to select whether the light passing through the base substrate 101 to pass or be shielded, so as to improve the uniformity of light passing through the base substrate 101, thereby improving the uniformity of light emitted by the light-emitting substrate 10, and improving the light-emitting uniformity of the whole light-emitting substrate 10.

For example, the plurality of second driving signal line groups 302 extending in the row direction R1 and the plurality of first driving signal line groups 301 extending in a zigzag way along the column direction R2 may cross each other to form a plurality of triangle structures. For example, in the case that the light-emitting units 201 adjacent to each other and in different rows or different columns illustrated in the above-mentioned FIG. 1 form an approximate equilateral triangle structure, a plurality of second driving signal line groups 302 and a plurality of first driving signal line groups 301 may cross each other and approximately form a plurality of equilateral triangle structures, thereby improving the uniformity of the grid-like wiring structure formed by the first driving signal lines 310 in the first driving signal line groups 301 and the second driving signal lines 320 in the second driving signal line groups 302 on the base substrate 101. For example, in the case that the first driving signal line group 301 and the second driving signal line group 302 adopt the above arrangement, the light-emitting uniformity of the light-emitting substrate 10 illustrated in FIG. 1 can be increased to about 65.5%, so that the light-emitting uniformity of the light-emitting substrate 10 can be significantly increased.

For example, in the embodiments illustrated in FIG. 1, the second driving signal line group 302 and the second driving signal line 320 in the second driving signal line group 302 may extend substantially linearly along the row direction R1. Alternatively, in other embodiments of the present disclosure, the second driving signal line group 302 and the second driving signal line 320 therein may extend along the row direction R1 in a broken-line, curved or other suitable shape, and the embodiments of the present disclosure are not limited in this aspect.

It should be noted that in the embodiments of the present disclosure, different second driving signal line groups 302 or different second driving signal lines 320 in each second driving signal line group 302 may be the same as or different from each other. For example, the overall width in the column direction R2, the overall extending shape in the row direction R1, or the like of each second driving signal line group 302 may be the same as or different from each other. For example, the width in the column direction R2, the specific extending shape along the row direction R1, or the like of the second driving signal line 320 in the second driving signal line group 302 may be the same as or different from each other, and the embodiments of the present disclosure are not limited in this aspect.

For example, in some embodiments of the present disclosure, each first driving signal line group 301 may be configured to be connected to different signal sources to receive corresponding first electrode signals, and each second driving signal line group 302 may be configured to be connected to different signal sources to receive corresponding second electrode signals, so that under the control of the first electrode signal provided by the first driving signal line 310 and the second electrode signal provided by the second driving signal line 320, each light-emitting unit 201 in the light-emitting substrate 10 may serve as an independent light-emitting region, thereby maximizing the partition control of light-emitting units 201 in the light-emitting substrate 10. Thus, in the case that the light-emitting substrate 10 is applied to, for example, a display product to provide light for display, the display product can achieve a higher level (for example, the highest level) of display contrast, thereby improving the image display effect of the display product. Alternatively, in other embodiments of the present disclosure, two adjacent first driving signal line groups 301 may be connected to the same signal source to share the same first electrode signal, or two adjacent second driving signal line groups 302 may be connected to the same signal source to share the same second electrode signal, so that in the case that the light-emitting substrate 10 is applied to, for example, a display product to provide light for display, the image display effect of the display product can be ensured, and the display control manner of the display product can be optimized, thereby reducing the driving cost of the display product.

Figure 5:
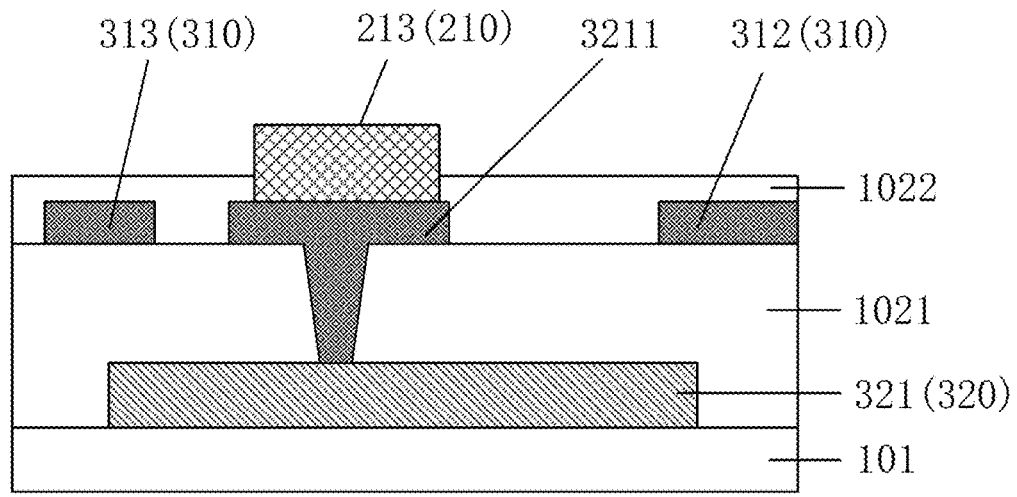
FIG. 5 is a schematic diagram of a partial cross-sectional structure along a line AA' illustrated in FIG. 4.

For example, the first driving signal line 310 and the second driving signal line 320 may be respectively located in different layers of the light-emitting substrate 10. FIG. 5 is a schematic diagram of a partial cross-sectional structure along a line AA' illustrated in FIG. 4. For example, as illustrated in FIG. 4 and FIG. 5, the first driving signal line 310 (such as the second light-emitting signal line 312 and the third light-emitting signal line 313 illustrated in FIG. 4 and FIG. 5) may be located on the side of the second driving signal line 320 (such as the fourth light-emitting signal line 321 illustrated in FIG. 4 and FIG. 5, which will be described later) away from the base substrate 101. Alternatively, in other embodiments of the present disclosure, the first driving signal line 310 may also be located on the side of the second driving signal line 320 close to the base substrate 101, and the embodiments of the present disclosure are not limited in this aspect.

For example, in the light-emitting substrate 10 provided by the embodiments of the present disclosure, the first electrode terminal of the light-emitting sub-unit 210 may be in direct contact with the first driving signal line 310 to realize electrical connection, or an insulating layer or other interlayer structures may be provided between the first electrode terminal of the light-emitting sub-unit 210 and the first driving signal line 310, and the electrical connection may be realized through via hole design penetrating the insulating layer or other interlayer structures. The second electrode terminal of the light-emitting sub-unit 210 may be in direct contact with the second driving signal line 320 to realize electrical connection, or an insulating layer or other interlayer structures may be provided between the second electrode terminal of the light-emitting sub-unit 210 and the second driving signal line 320, and the electrical connection may be realized through via hole design penetrating the insulating layer or other interlayer structures. In the embodiments of the present disclosure, the specific connection manner between the first electrode terminal of the light-emitting sub-unit 210 and the first driving signal line 310 and the specific connection manner between the second electrode terminal of the light-emitting sub-unit 210 and the second driving signal line 320 are not limited.

For example, taking the first driving signal line 310 illustrated in FIG. 5 as an example, which is located on the side of the second driving signal line 320 away from the base substrate 101, for example, insulating layers 1021 and 1022 or other interlayer structures may be provided between the second electrode terminal of the light-emitting sub-unit 210 and the second driving signal line 320, and the electrical connection may be realized through the via hole design penetrating the insulating layers 1021 and 1022 or other interlayer structures. For example, as illustrated in FIG. 4 and FIG. 5, the second electrode terminal of the light-emitting sub-unit 210 and the second driving signal line 320 may be electrically connected through a conductive connector 3211, for example, the conductive connector 3211 may be arranged in the same layer as the first driving signal line 310 and electrically connected with the second driving signal line 320 through a via hole penetrating the insulating layer 1021. It should be noted that, in other embodiments of the present disclosure, the light-emitting sub-unit 210 and the second driving signal line 320 may also be arranged and connected in other suitable ways in the direction perpendicular to the base substrate 101, and the embodiments of the present disclosure are not limited in this aspect.

In some embodiments of the present disclosure, the light-emitting sub-unit 210 may be a light-emitting diode chip, such as a mini light-emitting diode chip. For example, the maximum size of the mini light-emitting diode chip in the plane parallel to the main surface of the base substrate 101 does not exceed 500 μm, for example, it may range from 100 μm to 500 μm, and further 150 μm to 350 μm, etc. For example, the size of the mini light-emitting diode chip may be 0.2 mm×0.4 mm (width×length).

In some embodiments of the present disclosure, the light-emitting sub-unit 210 may also be a micro light-emitting diode chip. For example, the maximum size of the micro light-emitting diode chip in the plane parallel to the main surface of the base substrate 101 is not more than 100 μm, for example, it may be 20 μm-100 μm, and further 30 μm-80 μm, etc.

In some embodiments of the present disclosure, the base substrate 101 may be a glass substrate, which can further reduce the manufacturing cost of the light-emitting substrate 10, and also improve the heat dissipation performance of the base substrate 101, thus improving the overall performance of the light-emitting substrate 10. In some embodiments of the present disclosure, the base substrate 101 may also be a base substrate provided with a printed circuit board, so that the resistance thermal effect of the first driving signal line 310 and the second driving signal line 320 may be reduced by, for example, reducing the width and increasing the thickness of the first driving signal line 310 and the second driving signal line 320. In addition, the possible parasitic capacitance may be reduced or avoided by adding an additional layer structure between the first driving signal line 310 and the second driving signal line 320. In other embodiments of the present disclosure, the base substrate 101 may also adopt other suitable base materials, and the embodiments of the present disclosure are not limited in this aspect.

For example, the first driving signal line 310 and the second driving signal line 320 may adopt metal conductive materials such as copper, copper alloy, etc., or other types of conductive materials, and the embodiments of the present disclosure are not limited in this aspect. For example, taking the first driving signal line 310 and the second driving signal line 320 adopting the copper as an example, the thickness of the first driving signal line 310 and the thickness of the second driving signal line 320 in the direction perpendicular to the base substrate 101 can be about 1.8 μm, so that the copper metal conductive layer with this thickness can be prepared by a sputtering process without an electroplating process, thereby further reducing the manufacturing cost of the light-emitting substrate 10 and simplifying the manufacturing process. Alternatively, in some embodiments of the present disclosure, the first driving signal line 310 and the second driving signal line 320 can also be prepared by electroplating or other suitable process, and the present disclosure is not limited in this aspect. For example, the materials of the first driving signal line 310 and the second driving signal line 320 may include a single-layer metal structure, or may also include a metal laminated structure formed of copper metal and molybdenum metal, such as a double laminated metal structure formed of copper metal and molybdenum metal, or a triple laminated metal structure formed of molybdenum-copper-molybdenum (Mo—Cu—Mo), etc., and the embodiments of the present disclosure are not limited in this aspect.

For example, as illustrated in FIG. 4 and FIG. 5, the second driving signal lines 320 in each second driving signal line group 302 include a fourth light-emitting signal line 321 corresponding to the third light-emitting sub-unit 213 and a fifth light-emitting signal line 322 corresponding to the first light-emitting sub-unit 211. The fourth light-emitting signal line 321 is configured to be connected with the second electrode terminal of the third light-emitting sub-unit 213 to provide the second electrode signal corresponding to the third light-emitting sub-unit 213. The fifth light-emitting signal line 322 is configured to be connected with the second electrode terminal of the first light-emitting sub-unit 211 to provide the second electrode signal corresponding to the first light-emitting sub-unit 211.

For example, the second driving signal lines 320 in each second driving signal line group 302 further include a sixth light-emitting signal line 323 corresponding to the second light-emitting sub-unit 212, and the sixth light-emitting signal line 323 is configured to be connected with the second electrode terminal of the second light-emitting sub-unit 212 to provide the second electrode signal corresponding to the second light-emitting sub-unit 212. For example, in each second driving signal line group 302, the sixth light-emitting signal line 323 may be located between the fourth light-emitting signal line 321 and the fifth light-emitting signal line 322 in the column direction R2.

For example, the fifth light-emitting signal line 322 and the sixth light-emitting signal line 323 may be electrically connected to each other to transmit the same second electrode signal, thereby reducing the transmission resistance of the second electrode signal in the light-emitting substrate 10 and improving the transmission stability of the second electrode signal in the light-emitting substrate 10. For example, as illustrated in FIG. 4, in each second driving signal line group 302, the sixth light-emitting signal line 323 can be connected with the fifth light-emitting signal line 322 through a connection portion 324 between the sixth light-emitting signal line 323 and the fifth light-emitting signal line 322, and the fifth light-emitting signal line 322, the sixth light-emitting signal line 323, and the connection portion 324 can be integrally provided, thereby reducing the manufacturing cost of the second driving signal line group 302 and simplifying the manufacturing process. For example, further, the fourth light-emitting signal line 321 may be integrally provided with the fifth light-emitting signal line 322 and the sixth light-emitting signal line 323, so as to further reduce the manufacturing cost of the second driving signal line group 302 and simplify the manufacturing process. The embodiments of the present disclosure are not limited in this aspect.

For example, each second driving signal line group 302 further includes a plurality of groups of conductive portions corresponding to light-emitting units 201 in a row, and each group of conductive portions includes a first conductive portion 325 and a second conductive portion 326. For example, the first conductive portion 325 and the second conductive portion 326 may be referred to as illustrated in FIG. 4 or as illustrated in FIG. 9.

The first conductive portion 325 is connected with the fourth light-emitting signal line 321 and extends from the fourth light-emitting signal line 321 towards the side close to the third light-emitting sub-unit 213 in the light-emitting unit 201 corresponding to the first conductive portion 325, so that the orthographic projection of the first conductive portion 325 on the base substrate 101 and the orthographic projection of the third light-emitting sub-unit 213 in the corresponding light-emitting unit 201 on the base substrate 101 at least partially overlap with each other.

Figure 9:
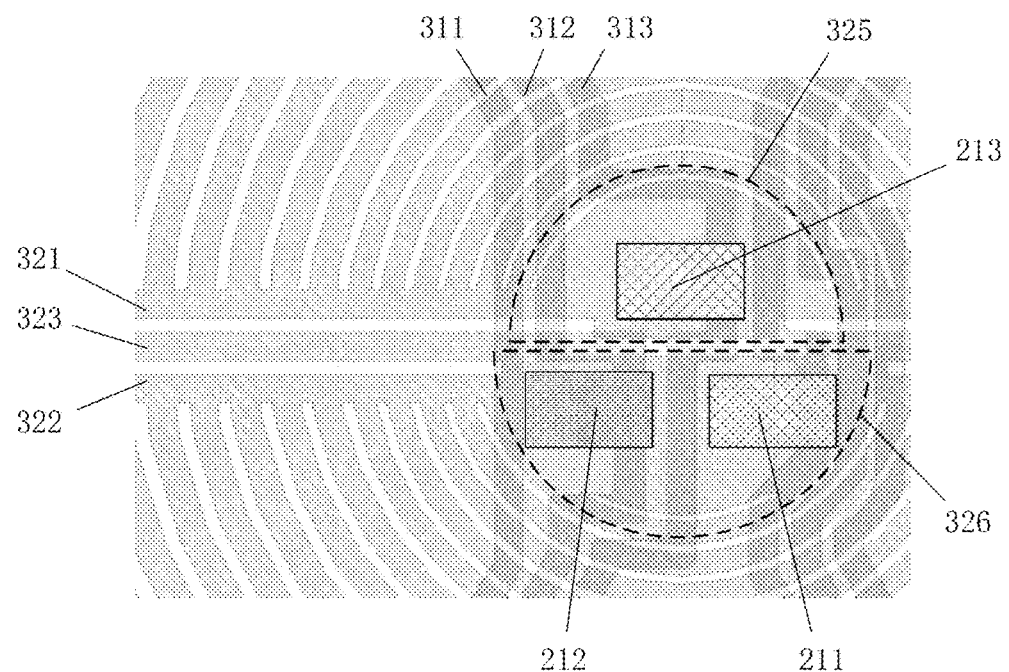
FIG. 9 is a partially enlarged schematic diagram of a region AR2 illustrated in FIG. 8.

For example, taking the case illustrated in FIG. 4 or FIG. 9 as an example, the first conductive portion 325 may be connected to and integrally provided with the fourth light-emitting signal line 321, and the first conductive portion 325 may extend upward from the fourth light-emitting signal line 321, for example, forming an approximately semicircular structure, and the orthographic projection of the third light-emitting sub-unit 213 on the base substrate 101 may be located in the region surrounded by the outer contour of the orthographic projection of the first conductive portion 325 on the base substrate 101. Therefore, the light source center (and the position close to the light source center) of the third light-emitting sub-unit 213 can be blocked by the first conductive portion 325, so that the uniformity of the light passing through in the whole light-emitting substrate 10 can be improved, and the uniformity of the light emitted by the light-emitting substrate 10 can be improved.

The second conductive portion 326 is connected to the fifth light-emitting signal line 322 and extends from the fifth light-emitting signal line 322 towards the side close to the first light-emitting sub-unit 211 (and the second light-emitting sub-unit 212) in the light-emitting unit 201 corresponding to the second conductive portion 326, so that the orthographic projection of the second conductive portion 326 on the base substrate 101 and the orthographic projection of the first light-emitting sub-unit 211 (and the second light-emitting sub-unit 212) in the corresponding light-emitting unit 201 on the base substrate 101 at least partially overlap with each other.

For example, taking the case illustrated in FIG. 4 or FIG. 9 as an example, the second conductive portion 326 may be connected to and integrally provided with the fifth light-emitting signal line 322, and the second conductive portion 326 extends downward from the fifth light-emitting signal line 322, for example, it may form a semi-circular structure. The orthographic projection of the first light-emitting sub-unit 211 (and the second light-emitting sub-unit 212) on the base substrate 101 can be located in the region surrounded by the outer contour of the orthographic projection of the second conductive portion 326 on the base substrate 101, so that the second conductive portion 326 can be used to block the light source center (and the position close to the light source center) of the first light-emitting sub-unit 211 (and the second light-emitting sub-unit 212), thereby improving the uniformity of the light passing through in the whole light-emitting substrate 10, and improving the uniformity of the light emitted by the light-emitting substrate 10.

For example, in the embodiments illustrated in FIG. 4, in the direction perpendicular to the base substrate 101, the overlapping part between the second driving signal line group 302 and the light-emitting unit 201 (such as the first conductive portion 325 and the second conductive portion 326) can be designed as a nearly circular or semicircular wiring structure, so that the transmission load of the second electrode signal in the light-emitting substrate 10 can be reduced by the semicircular wiring part. It is also possible to properly shield the central part of the light emitted from the light-emitting unit 201 by the semicircular wiring part, so as to reduce the light intensity of the corresponding part of the light-emitting substrate 10, and further improve the uniformity of the light emitted by the whole light-emitting substrate 10.

Figure 6:
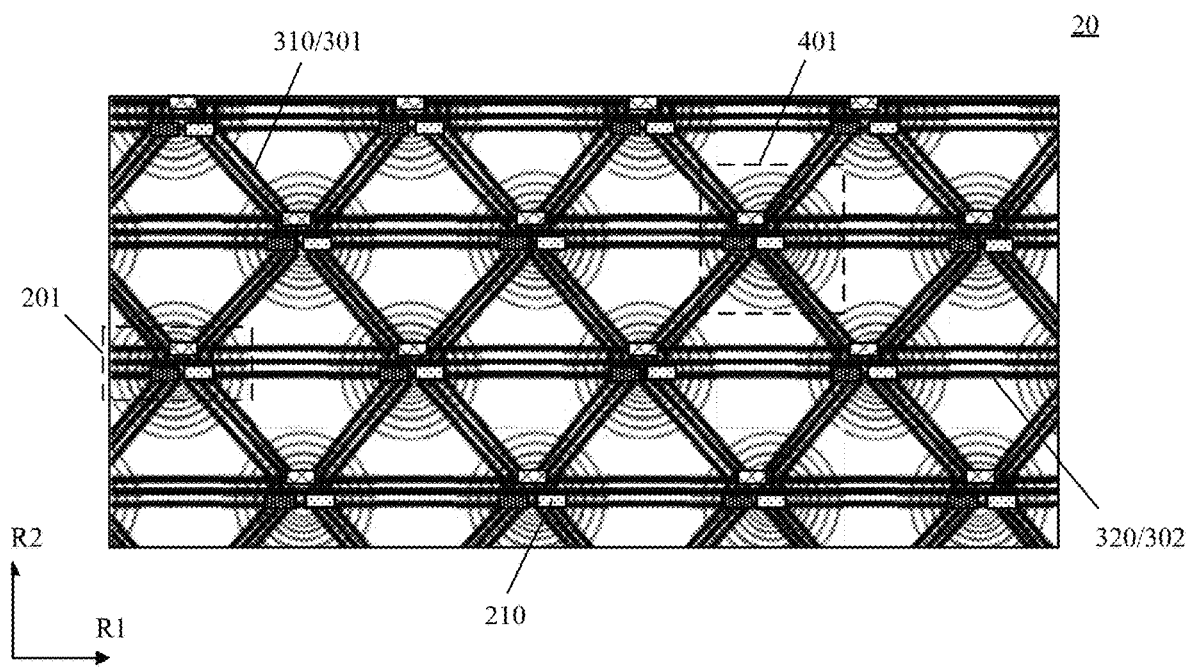
FIG. 6 is a schematic planar diagram of another light-emitting substrate provided by some embodiments of the present disclosure.

FIG. 6 is a schematic planar diagram of another light-emitting substrate provided by some embodiments of the present disclosure. It should be noted that other structures except for the conductive structure 401 in the light-emitting substrate 20 illustrated in FIG. 6 are substantially the same as or similar to those in the light-emitting substrate 10 illustrated in FIG. 1, and will not be repeated here.

For example, as illustrated in FIG. 6, the light-emitting substrate 20 further includes a plurality of conductive structures 401 in one-to-one correspondence with the plurality of light-emitting units 201. For example, the orthographic projection of each light-emitting unit 201 on the base substrate 101 is located in the region surrounded by the outer contour of the orthographic projection of the conductive structure 401 corresponding to the light-emitting unit 201 on the base substrate 101. In the direction that the center of each conductive structure 401 points to the edge, that is, in the direction from a near position to a far position from the center of the light-emitting unit 201, the conductive structure 401 is divided into a plurality of regions, and the light transmittance of these regions may be different from each other. Therefore, the plurality of regions of the conductive structure 401 can be used to further optimize the design of uniform light of the light-emitting substrate 20, so as to better solve the problem of uneven local brightness of the light-emitting substrate 20 and further optimize the uniformity of the light emitted by the whole light-emitting substrate 20.

Figure 7A:
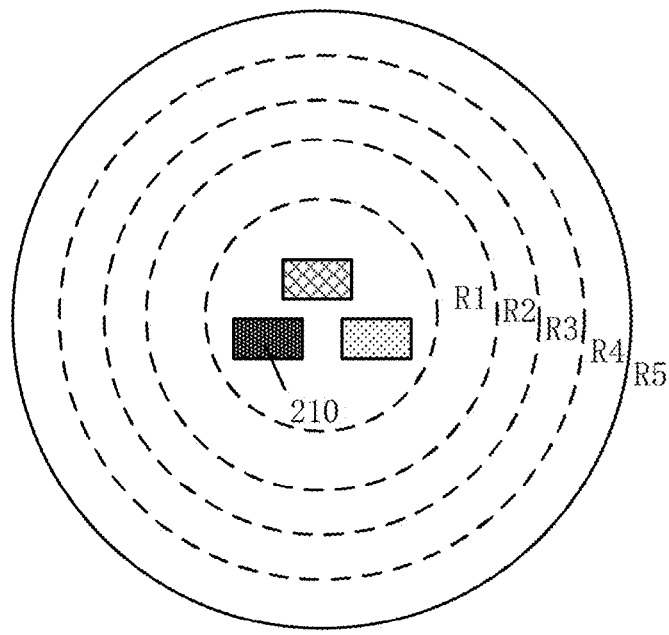
FIG. 7A and FIG. 7B are schematic diagrams of a region dividing method of a conductive structure provided by some embodiments of the present disclosure.
Figure 7B:
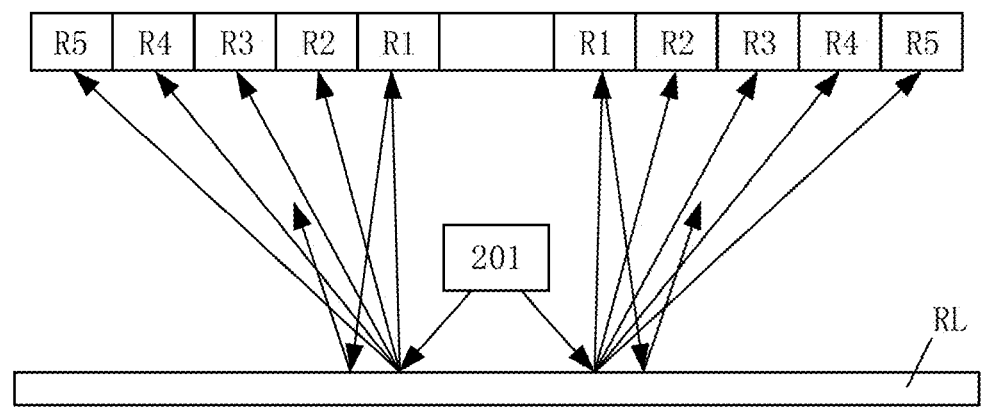
Figure 8:
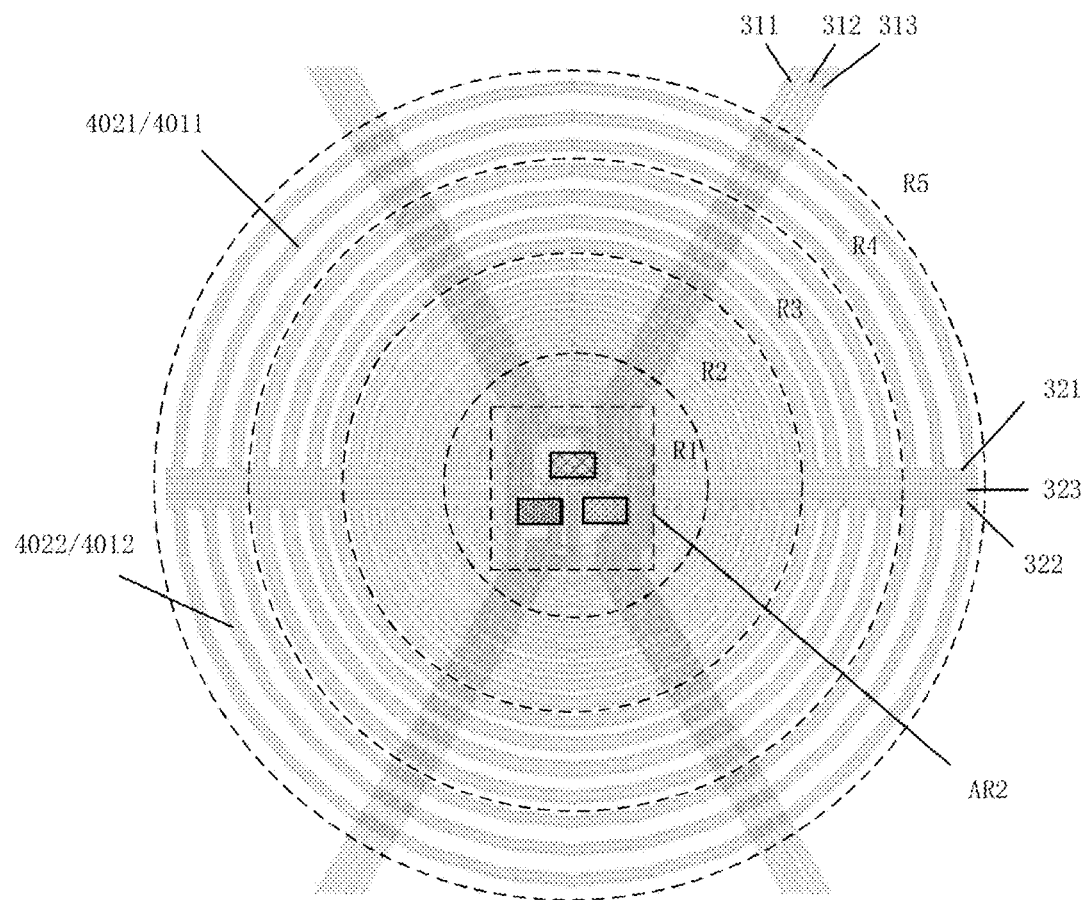
FIG. 8 is a schematic diagram of a specific example of a conductive structure provided by some embodiments of the present disclosure.

FIG. 7A and FIG. 7B are schematic diagrams of a region dividing method of a conductive structure provided by some embodiments of the present disclosure, FIG. 8 is a schematic diagram of a specific example of a conductive structure provided by some embodiments of the present disclosure, and FIG. 9 is a partially enlarged schematic diagram of a region AR2 illustrated in FIG. 8.

For example, as illustrated in FIG. 7A, FIG. 7B and FIG. 8, the conductive structure 401 can be divided into a plurality of regions R1, R2, R3 and R4, and the light transmittance of the conductive structure 401 in these regions R1, R2, R3 and R4 may be different from each other. For example, the light emitted by the light-emitting unit 201 can be reflected by a structure with a reflective function, such as a reflective layer RL, and the reflected light is emitted from the light-emitting substrate 20 through the conductive structure 401 as the outgoing light. For example, taking each light-emitting sub-unit 210 in the light-emitting unit 201 being a point light source as an example, in the structure where the light-emitting substrate 20 adopts a reflective light-emitting structure, since the light emitted by each light-emitting sub-unit 210 is reflected by a structure with a reflective function, such as the reflective layer RL, the light reflected to different regions R1, R2, R3 and R4 of the conductive structure 401 will show a gradual attenuation change. For example, the intensity of the reflected light received in the region R1 of the conductive structure 401 is the highest, and the intensity of the reflected light received in the region R4 of the conductive structure 401 is the lowest. Therefore, by adjusting the light transmittance of different regions R1, R2, R3 and R4 of the conductive structure 401, the light reflected by the reflective layer R1 can be repeatedly reflected by the multiple regions R1, R2, R3 and R4 of the conductive structure 401, and finally the difference in the light intensity of the light emitted from each region of the conductive structure 401 can be reduced, thereby improving the uniformity of the light emitted by the light-emitting substrate 20.

For example, the center of each conductive structure 401 and the center of the light-emitting unit 201 corresponding to the conductive structure 401 overlap in the direction perpendicular to the base substrate 101, so that the conductive structure 401 is conducive to the design of uniform light for the light emitted by the light-emitting unit 201 corresponding to the conductive structure 401, thereby improving the uniformity of the outgoing light of the light-emitting substrate 20.

For example, the shapes of the orthographic projections of the plurality of conductive structures 401 on the base substrate 101 may be approximately the same as each other, and the orthographic projections of the plurality of conductive structures 401 on the base substrate 101 may not overlap with each other, so that the light emitted by the plurality of light-emitting units 201 in the light-emitting substrate 20 can be subjected to a basically uniform light equalizing effect, and the uniformity of the outgoing light of the light-emitting substrate 20 can be further improved.

For example, taking the regions R1, R2, R3 and R4 of the conductive structure 401 illustrated in FIG. 7A, FIG. 7B and FIG. 8 as an example, the light transmittance of the regions R1, R2, R3 and R4 of the conductive structure 401 may gradually increase along the direction that the center of each conductive structure 401 points to the edge, that is, the light transmittance of the region R2 of the conductive structure 401 is higher than that of the region R1 of the conductive structure 401, the light transmittance of the region R3 of the conductive structure 401 is higher than that of the region R2 of the conductive structure 401, and the light transmittance of the region R4 of the conductive structure 401 is higher than that of the region R3 of the conductive structure 401. Therefore, the light quantity of the reflected light reflected by the reflective layer RL to different regions R1, R2, R3 and R4 of the conductive structure 401 can be matched with each other, so that the uniform design of the outgoing light passing through the conductive structure 401 can be realized.

Figure 10:
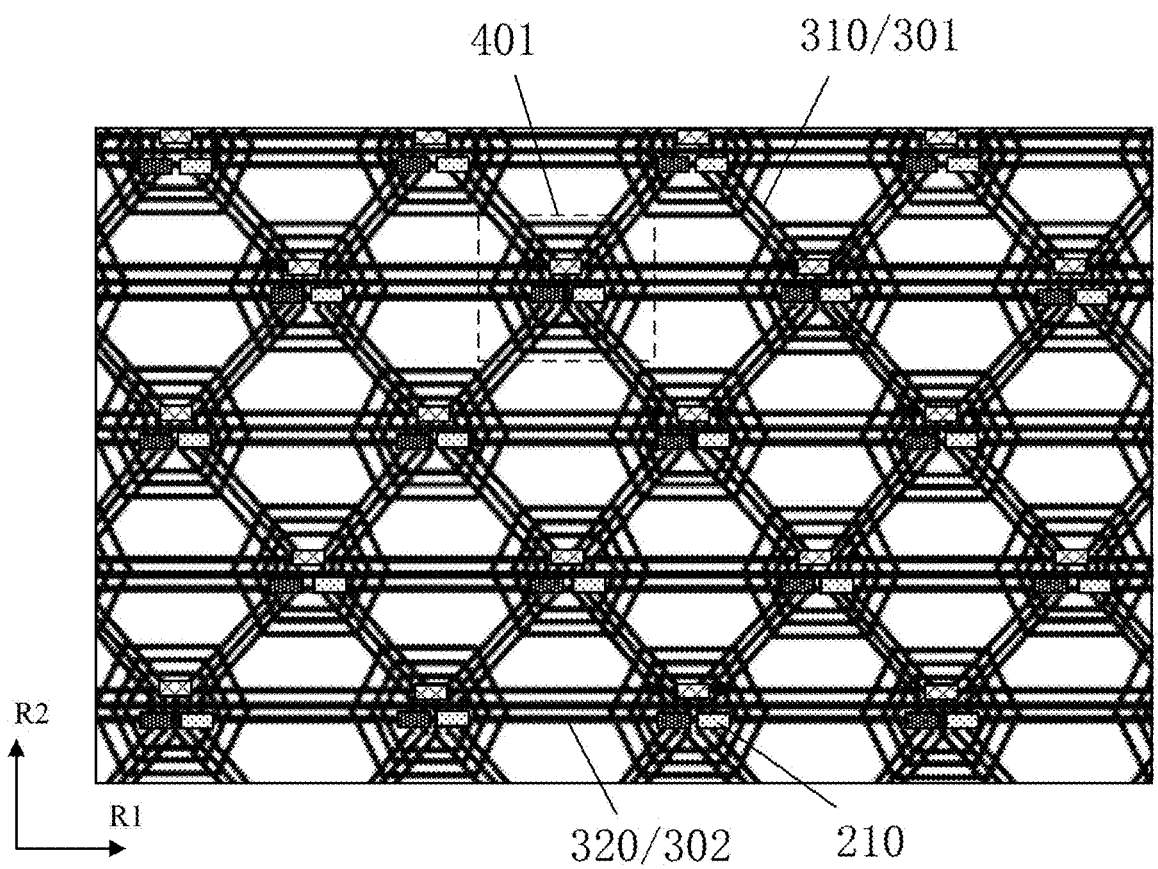
FIG. 10 is a schematic planar diagram of still another light-emitting substrate provided by some embodiments of the present disclosure.

For example, each conductive structure 401 in the light-emitting substrate 20 may be a centrosymmetric structure, so as to further improve the light equalizing effect of the outgoing light passing through the conductive structure 401. For example, the overall outline of the conductive structure 401 may be a circle as illustrated in FIG. 6 or FIG. 8, or a regular polygon as illustrated in FIG. 10, such as a regular hexagon. Alternatively, in other embodiments of the present disclosure, the conductive structure 401 may also take other suitable regular polygon shapes, such as the square, regular octagon, etc., or may further take other suitable regular or irregular shapes, such as the triangle, etc. The embodiments of the present disclosure are not limited to the specific shape, outline, or the like of the conductive structure 401.

For example, taking the case where the overall outline of the conductive structure 401 illustrated in FIG. 6 and FIG. 8 is a circle as an example, as illustrated in conjunction with FIG. 6, FIG. 8 and FIG. 9, each conductive structure 401 includes a first conductive sub-structure 4011 and a second conductive sub-structure 4012 that are opposite to each other in the column direction R2, and the first conductive sub-structure 4011 and the second conductive sub-structure 4012 are symmetrical with respect to the center of the conductive structure 401 along the row direction R1 to form the conductive structure 401. The first conductive sub-structure 4011 and the second conductive sub-structure 4012 are separated and insulated from each other. The orthographic projection of the first conductive sub-structure 4011 on the base substrate 101 is located on the side of the orthographic projection of the fourth light-emitting signal line 321 on the base substrate 101 away from the orthographic projection of the fifth light-emitting signal line 322 on the base substrate 101, and the orthographic projection of the second conductive sub-structure 4012 on the base substrate 101 is located on the side of the orthographic projection of the fifth light-emitting signal line 322 on the base substrate 101 away from the orthographic projection of the fourth light-emitting signal line 321 on the base substrate 101.

For example, in some embodiments of the present disclosure, the orthographic projection of the first conductive sub-structure 4011 on the base substrate 101 may at least partially overlap with the orthographic projection of the third light-emitting sub-unit 213 on the base substrate 101, and the orthographic projection of the second conductive sub-structure 4012 on the base substrate 101 may at least partially overlap with the orthographic projection of the first light-emitting sub-unit 211 (and the second light-emitting sub-unit 212) on the base substrate 101.

For example, the first conductive sub-structure 4011 is connected to the fourth light-emitting signal line 321, and the second conductive sub-structure 4012 is connected to the fifth light-emitting signal line 322, so that the transmission load of the second electrode signal on the fourth light-emitting signal line 321 and the transmission load of the second electrode signal on the fifth light-emitting signal line 322 (and the sixth light-emitting signal line 323 electrically connected to the fifth light-emitting signal line 322) can be reduced, thereby optimizing the overall performance of the light-emitting substrate 20.

It should be noted that, in other embodiments of the present disclosure, the first conductive sub-structure 4011 and the second conductive sub-structure 4012 can also be configured to receive other types of electrical signals, for example, they can also be grounded or in a floating state, and the embodiments of the present disclosure are not limited in this aspect.

For example, the first conductive sub-structure 4011 can be integrated with the fourth light-emitting signal line 321, and the second conductive sub-structure 4012 can be integrated with the fifth light-emitting signal line 322, thereby further reducing the manufacturing cost of the light-emitting substrate 20, reducing the number of mask structures needed in the manufacturing process, and simplifying the manufacturing process.

For example, as illustrated in FIG. 6, FIG. 8 and FIG. 9, the first conductive sub-structure 4011 includes a plurality of first semi-annular portions 4021 arranged in sequence along the direction that the center of each conductive structure 401 points to the edge of the conductive structure 401, and both ends of each first semi-annular portion 4021 are respectively connected with the fourth light-emitting signal line 321, so that two adjacent first semi-annular portions 4021 are electrically connected to each other and form an opening region. Among the plurality of first semi-annular portions 4021, the distance between two adjacent first semi-annular portions 4021 located in different regions of the conductive structures 401 gradually increases in the direction from the center of each conductive structure 401 to the edge of the conductive structure 401. The second conductive sub-structure 4012 includes a plurality of second semi-annular portions 4022 arranged in sequence along the direction that the center of each conductive structure 401 points to the edge of the conductive structure 401, and both ends of each second semi-annular portion 4022 are respectively connected with the fifth light-emitting signal line 322, so that two adjacent second semi-annular portions 4022 are electrically connected to each other and form an opening region. Among the plurality of second semi-annular portions 4022, the distance between two adjacent second semi-annular portions 4022 located in different regions of the conductive structures 401 gradually increases along the direction from the center of each conductive structure 401 to the edge of the conductive structure 401.

For example, the region R1 of the first conductive sub-structure 4011 may include five first semi-annular portions 4021, and the region R1 of the second conductive sub-structure 4012 may include five second semi-annular portions 4022. For example, the widths of the five first semi-annular portions 4021 and the five second semi-annular portions 4022 may be set to 40 μm. For the five first semi-annular portions 4021, the spacing between adjacent first semi-annular portions 4021 may be set to 12.5 μm, 12.5 μm, 15 μm and 15 μm, respectively, along the direction from the center of the conductive structure 401 to the edge of the conductive structure 401. For the five second semi-annular portions 4022, the spacing between adjacent second semi-annular portions 4022 may be set to 12.5 μm, 12.5 μm, 15 μm and 15 μm, respectively, along the direction from the center of the conductive structure 401 to the edge of the conductive structure 401. For example, for the region R1 of the conductive structure 401, since the received light intensity reflected by the light-emitting unit 201 is the largest and the reflected light quantity is the largest, the arrangement density of the first semi-annular portion 4021 and the second semi-annular portion 4022 included in the region R1 of the conductive structure 401 is the largest, and the formed opening region is the smallest. For example, the aperture ratio of the region R1 of the conductive structure 401 is about 15%, so that most of the light reflected to the region R1 of the conductive structure 401 can be further reflected to the region R2 of the conductive structure 401 through the first semi-annular portion 4021 and the second semi-annular portion 4022.

For example, the region R2 of the first conductive sub-structure 4011 may include seven first semi-annular portions 4021, and the region R2 of the second conductive sub-structure 4012 may include seven second semi-annular portions 4022. For example, the widths of the seven first semi-annular portions 4021 may be set to 40 μm, 50 μm, 50 μm, 52.5 μm, 52.5 μm, 55 μm and 55 μm, respectively. The widths of the seven second semi-annular portions 4022 may be set to 40 μm, 50 μm, 50 μm, 52.5 μm, 52.5 μm, 55 μm and 55 μm, respectively. For the seven first semi-annular portions 4021, the spacing between adjacent first semi-annular portions 4021 may be set to 20 μm, 20 μm, 22.5 μm, 22.5 μm, 25 μm and 27.5 μm, respectively, along the direction from the center of the conductive structure 401 to the edge of the conductive structure 401. For the seven second semi-annular portions 4022, the spacing between adjacent second semi-annular portions 4022 may be set to 20 μm, 20 μm, 22.5 μm, 22.5 μm, 25 μm and 27.5 μm, respectively, along the direction from the center of the conductive structure 401 to the edge of the conductive structure 401. For example, for the region R2 of the conductive structure 401, since the region R2 is close to the region R1, it is relatively close to the center of the light-emitting unit 201, and there may be light directly reflected by the light-emitting unit 201 and light reflected by the first semi-annular portion 4021 and the second semi-annular portion 4022 of the region R1, and the light intensity and quantity may be relatively strong. Therefore, the arrangement density of the first semi-annular portion 4021 and the second semi-annular portion 4022 included in the region R2 of the conductive structure 401 may be smaller than that of the first semi-annular portion 4021 and the second semi-annular portion 4022 included in the region R1. For example, the aperture ratio of the region R2 of the conductive structure 401 may be about 27.5%, so that most of the light received by the region R2 is further reflected to the region R3 of the conductive structure 401 again.

For example, the region R3 of the first conductive sub-structure 4011 may include five first semi-annular portions 4021, and the region R3 of the second conductive sub-structure 4012 may include five second semi-annular portions 4022. For example, the widths of the five first semi-annular portions 4021 may be set to 60 μm, 60 μm, 65 μm, 65 μm and 70 μm, respectively. The widths of the five second semi-annular portions 4022 may be set to 60 μm, 60 μm, 65

µm, 65 µm and 70 µm, respectively. For the five first semi-annular portions 4021, the spacing between adjacent first semi-annular portions 4021 may be set to 40 µm, 50 µm, 60 µm and 70 µm, respectively, along the direction from the center of the conductive structure 401 to the edge of the conductive structure 401. For the five second semi-annular portions 4022, the spacing between adjacent second semi-annular portions 4022 may be set to 40 µm, 50 µm, 60 µm and 70 µm, respectively, along the direction from the center of the conductive structure 401 to the edge of the conductive structure 401. For example, for the region R3 of the conductive structure 401, since the light intensity directly reflected by the light-emitting unit 201 received by the region R3 is ordinary, but there is light reflected again by the region R2, the distance between the adjacent first semi-annular portions 4021 and the distance between the adjacent second semi-annular portions 4022 of the region R3 can be gradually increased, so that 38% of the light received by the region R3 is emitted as the outgoing light of the light-emitting substrate 20, and 62% of the received light is further reflected to the region R4 of the conductive structure 401.

For example, the region R4 of the first conductive sub-structure 4011 may include three first semi-annular portions 4021, and the region R4 of the second conductive sub-structure 4012 may include three second semi-annular portions 4022. For example, the widths of the three first semi-annular portions 4021 may be set to 50 µm, respectively. The widths of the three second semi-annular portions 4022 may be set to 50 µm, respectively. For the three first semi-annular portions 4021, the spacing between adjacent first semi-annular portions 4021 may be set to 90 µm and 110 µm, respectively, along the direction from the center of the conductive structure 401 to the edge of the conductive structure 401. For the three second semi-annular portions 4022, the spacing between adjacent second semi-annular portions 4022 may be set to 90 µm and 110 µm, respectively, along the direction from the center of the conductive structure 401 to the edge of the conductive structure 401. For example, the aperture ratio of the region R4 of the conductive structure 401 can be designed to be about 65%, so that most of the light received by the region R4 is emitted as the outgoing light of the light-emitting substrate 20, and a small amount of light is further reflected to the region R5 illustrated in FIG. 7A, FIG. 7B and FIG. 8.

For example, as illustrated in FIG. 8, the first semi-annular portion 4021 or the second semi-annular portion 4022 may not be provided in the region R5. Because the region R5 is far away from the center of the light-emitting unit 201, the light intensity reaching the region R5 after multiple reflections is weak, and the light quantity is small. For example, the light reflected to the region R5 only accounts for 13% of the light emitted by the light-emitting unit 201 without considering the light loss. Therefore, after combining the light reflected to the region R5 by the first semi-annular portion 4021 and the second semi-annular portion 4022 of the region R4, the light emitted from the region R5 accounts for about 26% of the light emitted by the light-emitting unit 201, so as to be similar to that of the region R4.

Therefore, by setting the widths and spacing of the first semi-annular portion 4021 and the second semi-annular portion 4022 of the regions R1, R2, R3 and R4 of the conductive structure 401, the light transmittance of each region of the conductive structure 401 can be adjusted. For example, the light transmittance of each region is represented by the aperture ratio, and the light loss of the region R1 of the conductive structure 401 is almost zero, so that the aperture ratio of the region R1 should be about 8% less than that of other regions. While since the loss of light reflected by each region of the conductive structure 401 is about 1% to 3%, in order to keep the outgoing light of the light-emitting substrate 20 relatively uniform as a whole, the ratios between the outgoing light quantity of the regions R1, R2, R3, R4 and R5 of the conductive structure 401 and the total light quantity provided by the light-emitting unit 201 may be designed to be 15%, 23%, 24%, 25% and 26%, respectively. In summary, the light transmittance of the region R1 to the region R5 and the ratio between the outgoing light quantity and the total light quantity provided by the light-emitting unit 201 may be as follows: the light transmittance of the region R1 is 15%, so that 15% of the light is the outgoing light, and 85% of the light is reflected to the region R2; the light transmittance of the region R2 is 27.1%, so that 85%×27.1%=23% of the light is the outgoing light, and 1-15%-23%=62% of the light is reflected to the region R3; the light transmittance of the region R3 is 38.6%, so that 62%×38.6%=24% of the light is the outgoing light, and 1-15%-23%-24%=38% of the light is reflected to the region R4; the light transmittance of the region R4 is 66%, so that 38%×66%=25% of the light is the outgoing light, and 1-15%-23%-24%-25%=13% of the light is reflected to the region R5; the light transmittance of the region R5 is 100%, but the light emitted by two adjacent light-emitting units 201 may overlap, so that the light emitted from the region R5 is 13%×2=26%.

For example, after determining the different light transmittance of each region of the conductive structure 401, the light transmittance of each region of the conductive structure 401 can be achieved by adjusting the duty ratio of the first semi-annular portion 4021 and the second semi-annular portion 4022 of each region, so as to improve the uniformity of the light-emitting effect from the region R1 to the region R5.

For example, the widths of the first semi-annular portion 4021 and the second semi-annular portion 4022 may be set to approximate the width of the first driving signal line 310 or the second driving signal line 320, for example, approximately 50 µm. Furthermore, in the case where the widths of the first semi-annular portion 4021 and the second semi-annular portion 4022 are greater than 100 µm, the first semi-annular portion 4021 and the second semi-annular portion 4022 are easily visible to naked eyes, so that the widths of the first semi-annular portion 4021 and the second semi-annular portion 4022 from the region R1 to the region R4 can be increased from 40 µm, so that the maximum width reached by the increase does not exceed 70 µm. In addition, with regard to the spacing between adjacent first semi-annular portions 4021 and the spacing between adjacent second semi-annular portions 4022 in the regions R1 to R4, on the basis of considering the process requirements for the thickness of the first semi-annular portion 4021 and the thickness of the second semi-annular portion 4022, the distance between adjacent first semi-annular portions 4021 and the distance between adjacent second semi-annular portions 4022 can be increased from 12.5 µm, and in the process of increasing, if the light transmittance of a certain region of the conductive structure 401 does not match the expected value, the distance between adjacent first semi-annular portions 4021 and the distance between adjacent second semi-annular portions 4022 can be continuously kept consistent, or the distance between adjacent first semi-annular portions 4021 and the distance between adjacent second semi-annular portions 4022 can be increased by gradient. Therefore, the light-emitting uniformity of the light-emitting substrate 20 can be further improved to be about 80%.

For example, the light-emitting substrate provided by the embodiments of the present disclosure may further include a control circuit, which may be configured to be electrically connected with a plurality of driving signal lines (such as the first driving signal line 310 in the first driving signal line group 301, the second driving signal line 320 in the second driving signal line group 302, or the like in the above embodiments) respectively, so as to improve, for example, the first electrode signal and the second electrode signal. For example, the control circuit can be connected with an external power supply to drive each light-emitting unit in the light-emitting substrate by the voltage signal or current signal, such as partition and/or time sharing. For example, the external power supply may include a 12V voltage source and a serial peripheral interface. For example, the external power supply can be connected to the control circuit through a plurality of circuit controllers to realize partition control of the plurality of light-emitting units in the light-emitting substrate. For example, each circuit controller can be connected by signal lines such as power lines, clock lines, input/output lines (I/O lines), or the like to control the timing sequence of each circuit controller, and each circuit controller can be electrically connected with one or more light-emitting units to control multiple light-emitting units in the light-emitting substrate to emit light in time.

For example, the light-emitting substrate 10 and the light-emitting substrate 20 in the above embodiments of the present disclosure may be light-emitting diode substrates, which can be used as display substrates to realize display functions, or can also be used as the backlight of display devices to provide light sources. The embodiments of the present disclosure are not limited in this aspect.

At least one embodiment of the present disclosure further provides a display device, which includes a display panel and a light-emitting substrate according to any embodiment of the present disclosure, such as the light-emitting substrate 10 or the light-emitting substrate 20 in the above embodiments. The display panel has a display side and a non-display side, the light-emitting substrate is arranged on the non-display side of the display panel, and light-emitting units and first driving signal line groups in the light-emitting substrate are located on the side of the base substrate away from the display panel. For example, the light-emitting substrate can be used as a backlight unit in the display panel, or can also be used as a base substrate with a display function or a light-emitting function alone in the display panel.

Figure 12:
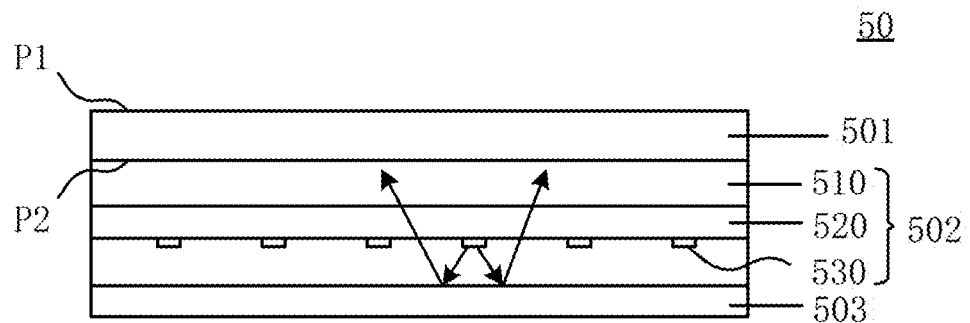
FIG. 12 is a schematic diagram of a partial cross-sectional structure of a specific example of a display device provided by some embodiments of the present disclosure.

FIG. 1I is a schematic block diagram of a display device provided by some embodiments of the present disclosure, and FIG. 12 is a schematic diagram of a partial cross-sectional structure of a specific example of a display device provided by some embodiments of the present disclosure.

Figure 11:
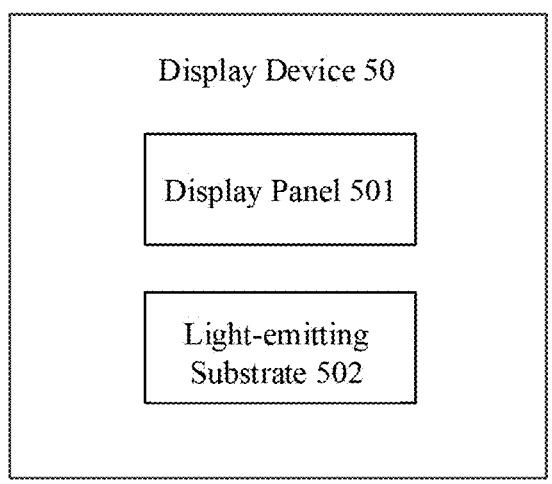
FIG. 11 is a schematic block diagram of a display device provided by some embodiments of the present disclosure.

For example, as illustrated in FIG. 11 and FIG. 12, the display device 50 includes a display panel 501 and a light-emitting substrate 502. For example, the light-emitting substrate 502 may be the light-emitting substrate provided in any embodiment of the present disclosure, such as the light-emitting substrate 10 or the light-emitting substrate 20 in the above-mentioned embodiments. The display panel 501 may be a liquid crystal display panel, an electronic paper display panel, etc., and the embodiments of the present disclosure are not limited in this aspect.

For example, as illustrated in FIG. 12, the display panel 501 has a display side P1 and a non-display side P2 opposite to the display side P1. For example, the display side Pt may be the side closer to the user in use. The light-emitting substrate 502 is disposed on the non-display side P2 of the display panel 501. For example, the light-emitting substrate 502 can be used as a backlight unit of the display panel 501. For example, the light-emitting substrate 502 can provide backlight to the display panel 501 as a surface light source. For example, the display panel 501 may be an LCD panel, an electronic paper display panel, etc., and the embodiments of the present disclosure are not limited in this aspect.

For example, the light-emitting substrate 502 is disposed on the non-display side P2 of the display panel 501, and light-emitting units 530 and first driving signal line groups 520 in the light-emitting substrate 502 are located on the side of the base substrate 510 away from the display panel 501. For example, in the light-emitting substrate 502, the light-emitting unit 530 may be located on the side of the first driving signal line group 520 away from the base substrate 510 as illustrated in FIG. 12. Alternatively, in other embodiments of the present disclosure, the light-emitting unit 530 may also be located on the side of the first driving signal line group 520 close to the base substrate 510, and the embodiments of the present disclosure are not limited in this aspect.

For example, the display device 50 further includes a reflective layer 503, which is located on the side of the light-emitting substrate 502 away from the display panel 501, so that the display device 50 is provided with a reflective (e.g., downward-emitting) backlight structure.

The structure, functions and technical effects of the display device provided by the above-mentioned embodiments may refer to the corresponding contents in the light-emitting substrate provided by the above-mentioned embodiments of the present disclosure, and are not repeated here.

For example, the display device provided by the embodiments of the present disclosure may be a liquid crystal display device, an electronic paper display device, or other devices with display functions, and the embodiments of the present disclosure are not limited in this aspect.

For example, the display device provided by the embodiments of the present disclosure can be any product or component with display functions, such as a display substrate, a display panel, electronic paper, a mobile phone, a tablet computer, a television, a display, a notebook computer, a digital photo frame, a navigator, etc., and the embodiments of the present disclosure are not limited in this aspect.

It should be noted that the light-emitting substrate provided by the embodiments of the present disclosure can be applied to the display device as a backlight unit, or can also be used as a base substrate with a display function or a light-emitting function alone, and the embodiments of the present disclosure are not limited in this aspect.

At least one embodiment of the present disclosure further provides an electronic apparatus, which includes the display device according to any embodiment of the present disclosure, for example, the display device 50 described above.

Figure 13:
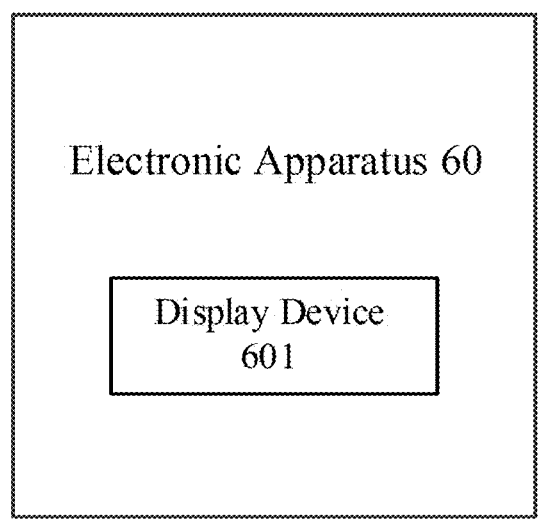
FIG. 13 is a schematic block diagram of an electronic apparatus provided by some embodiments of the present disclosure.

FIG. 13 is a schematic block diagram of an electronic apparatus provided by some embodiments of the present disclosure. For example, as illustrated in FIG. 13, the electronic apparatus 60 includes a display device 601. For example, the display device 601 may be the display device described in any embodiment of the present disclosure, such as the display device 50 in the above embodiments.

For example, the electronic apparatus 60 may be a display device or a display apparatus with a display function, such as an electronic paper display apparatus or a liquid crystal display apparatus.

For example, the electronic apparatus 60 may be any product or component with display functions, such as a display, an electronic paper display panel, an electronic paper display television, a liquid crystal display panel, a liquid crystal display television, a mobile phone, a tablet computer, a notebook computer, a digital photo frame, a navigator, etc.

For the present disclosure, the following statements should be noted.

(1) The accompanying drawings related to the embodiment(s) of the present disclosure involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a region may be enlarged or narrowed, that is, the drawings are not drawn in a real scale. It should be understood that, in the case that a component such as a layer, a film, a region, a substrate, or the like is referred to be "on" or "under" another component, the component may be "directly" "on" or "under" the another component, or an intermediate component may be disposed therebetween.

(3) In case of no conflict, the embodiments of the present disclosure and features in one embodiment or in different embodiments can be combined to obtain new embodiments.

What have been described above merely are specific implementations of the present disclosure, and the protection scope of the present disclosure is not limited thereto. Any modifications or substitutions that easily occur to those skilled in the art within the technical scope of the present disclosure should be within the protection scope of the present disclosure. Therefore, the protection scope of the present disclosure should be based on the protection scope of the claims.

The invention claimed is:

1. A light-emitting substrate, comprising:
    a base substrate; and
    a plurality of light-emitting units and a plurality of first driving signal line groups on the base substrate,
    wherein each of the light-emitting units comprises a plurality of light-emitting sub-units, and each of the light-emitting sub-units comprises a first electrode terminal and a second electrode terminal, a polarity of the second electrode terminal being opposite to a polarity of the first electrode terminal;
    each of the first driving signal line groups comprises at least one first driving signal line, and the first driving signal line is configured to be connected to the first electrode terminal of the light-emitting sub-unit to provide a first electrode signal;
    the plurality of light-emitting units are arranged in a plurality of columns and a plurality of rows along a row direction and a column direction, respectively;
    among an N-th column of light-emitting units and an (N+1)-th column of light-emitting units, a translational distance, in the column direction, is provided between a k-th light-emitting unit in the N-th column of light-emitting units and a k-th light-emitting unit in the (N+1)-th column of light-emitting units, and the translational distance is smaller than a spacing between two adjacent light-emitting units in a same column in the column direction, so as to allow light-emitting units in the N-th column and the (N+1)-th column to be respectively located in different rows in sequence, wherein N and k are positive integers greater than 0;
    a first driving signal line group is between the N-th column of light-emitting units and the (N+1)-th column of light-emitting units, and the first driving signal line group is in a zigzag extension along the column direction and alternately passes through a light-emitting unit of an M-th row and the N-th column, a light-emitting unit of an (M+1)-th row and the (N+1)-th column, and a light-emitting unit of an (M+2)-th row and the N-th column, so as to provide the first electrode signal to the light-emitting units in the N-th column and the (N+1)-th column, wherein M is a positive integer greater than 0;
    each of the light-emitting units is passed by two adjacent first driving signal line groups;
    the plurality of light-emitting sub-units in each of the light-emitting units comprise a first light-emitting sub-unit and a second light-emitting sub-unit;
    the at least one first driving signal line in each of the first driving signal line groups comprises a first light-emitting signal line corresponding to the first light-emitting sub-unit and a second light-emitting signal line corresponding to the second light-emitting sub-unit, the first light-emitting signal line is configured to be connected to the first electrode terminal of the first light-emitting sub-unit to provide a first electrode signal corresponding to the first light-emitting sub-unit, and the second light-emitting signal line is configured to be connected to the first electrode terminal of the second light-emitting sub-unit to provide a first electrode signal corresponding to the second light-emitting sub-unit; and
    between the N-th column of light-emitting units and the (N+1)-th column of light-emitting units, the first light-emitting signal line in the first driving signal line group is connected to the first light-emitting sub-unit in each of the light-emitting units in the N-th column, and the second light-emitting signal line in the first driving signal line group is connected to the second light-emitting sub-unit in each of the light-emitting units in the (N+1)-th column.

2. The light-emitting substrate according to claim 1, wherein between the N-th column of light-emitting units and the (N+1)-th column of light-emitting units, the first driving signal line group extends substantially along a straight line between two light-emitting units in two adjacent rows.

3. The light-emitting substrate according to claim 1, wherein the translational distance is equal to ½ of the spacing between two adjacent light-emitting units in the same column in the column direction; and
    between the N-th column of light-emitting units and the (N+1)-th column of light-emitting units, an included angle of an extending direction of the first driving signal line group between the light-emitting unit of the M-th row and the N-th column and the light-emitting unit of the (M+1)-th row and the (N+1)-th column with respect to the row direction is equal to an included angle of an extending direction of the first driving signal line group between the light-emitting unit of the (M+1)-th row and the (N+1)-th column and the light-emitting unit of the (M+2)-th row and the N-th column with respect to the row direction.

4. The light-emitting substrate according to claim 1, wherein between the N-th column of light-emitting units and the (N+1)-th column of light-emitting units, the first driving signal line group at least partially overlaps with each light-emitting unit in the N-th column and the (N+1)-th column in a direction perpendicular to the base substrate, so as to alternately pass through each light-emitting unit in the N-th column and the (N+1)-th column.

5. The light-emitting substrate according to claim 1, wherein the first light-emitting sub-unit and the second light-emitting sub-unit are arranged adjacent to each other in the row direction.

6. The light-emitting substrate according to claim 5, wherein in each of the first driving signal line groups, the first light-emitting signal line and the second light-emitting signal line are sequentially arranged in the row direction from the second light-emitting sub-unit to the first light-emitting sub-unit in each of the light-emitting units.

7. The light-emitting substrate according to claim 5, wherein between the (N+1)-th column of light-emitting units and the (N+2)-th column of light-emitting units, the first light-emitting signal line in the first driving signal line group is connected to the first light-emitting sub-unit in each of the light-emitting units in the (N+1)-th column, and the second light-emitting signal line in the first driving signal line group is connected to the second light-emitting sub-unit in each of the light-emitting units in the (N+2)-th column.

8. The light-emitting substrate according to claim 7, wherein the plurality of light-emitting sub-units in each of the light-emitting units further comprise a third light-emitting sub-unit, and the third light-emitting sub-unit is arranged side by side with the first light-emitting sub-unit and the second light-emitting sub-unit in the column direction;
the at least one first driving signal line in each of the first driving signal line groups further comprises a third light-emitting signal line corresponding to the third light-emitting sub-unit, and the third light-emitting signal line is configured to be connected to the first electrode terminal of the third light-emitting sub-unit to provide a first electrode signal corresponding to the third light-emitting sub-unit; and
between the N-th column of light-emitting units and the (N+1)-th column of light-emitting units, the third light-emitting signal line in the first driving signal line group is connected to the third light-emitting sub-unit in each light-emitting unit in the N-th column or connected to the third light-emitting sub-unit in each light-emitting unit in the (N+1)-th column.

9. The light-emitting substrate according to claim 8, wherein between the N-th column of light-emitting units and the (N+1)-th column of light-emitting units, the third light-emitting signal line in the first driving signal line group is connected to the third light-emitting sub-unit in each light-emitting unit in the (N+1)-th column; and
between the (N+1)-th column of light-emitting units and the (N+2)-th column of light-emitting units, the third light-emitting signal line in the first driving signal line group is connected to the third light-emitting sub-unit in each light-emitting unit in the (N+2)-th column.

10. The light-emitting substrate according to claim 8, wherein the second light-emitting sub-unit, the third light-emitting sub-unit, and the first light-emitting sub-unit are sequentially arranged in the row direction, and
in each of the first driving signal line groups, the first light-emitting signal line, the second light-emitting signal line, and the third light-emitting signal line are sequentially arranged in the row direction from the second light-emitting sub-unit to the first light-emitting sub-unit in each of the light-emitting units.

11. The light-emitting substrate according to claim 8, further comprising a plurality of second driving signal line groups,
wherein the plurality of second driving signal line groups respectively extend along the row direction and correspond to the plurality of rows of light-emitting units one by one; and
each of the second driving signal line groups comprises at least one second driving signal line, and the second driving signal line is configured to be connected to the second electrode terminal of the light-emitting sub-unit to provide a second electrode signal.

12. The light-emitting substrate according to claim 11, wherein the at least one second driving signal line in each of the second driving signal line groups comprises a fourth light-emitting signal line corresponding to the third light-emitting sub-unit and a fifth light-emitting signal line corresponding to the first light-emitting sub-unit,
the fourth light-emitting signal line is configured to be connected to the second electrode terminal of the third light-emitting sub-unit to provide a second electrode signal corresponding to the third light-emitting sub-unit, and
the fifth light-emitting signal line is configured to be connected to the second electrode terminal of the first light-emitting sub-unit to provide a second electrode signal corresponding to the first light-emitting sub-unit.

13. The light-emitting substrate according to claim 12, wherein the at least one second driving signal line in each of the second driving signal line groups further comprises a sixth light-emitting signal line corresponding to the second light-emitting sub-unit,
the sixth light-emitting signal line is configured to be connected to the second electrode terminal of the second light-emitting sub-unit to provide a second electrode signal corresponding to the second light-emitting sub-unit, and
in each of the second driving signal line groups, the sixth light-emitting signal line is between the fourth light-emitting signal line and the fifth light-emitting signal line in the column direction.

14. The light-emitting substrate according to claim 12, wherein each of the second driving signal line groups further comprises a plurality of groups of conductive portions in one-to-one correspondence with light-emitting units in one row, and each group of the conductive portions comprises a first conductive portion and a second conductive portion;
the first conductive portion is connected to the fourth light-emitting signal line and extends from the fourth light-emitting signal line toward a side close to a third light-emitting sub-unit in a light-emitting unit corresponding to the first conductive portion, so as to allow an orthographic projection of the first conductive portion on the base substrate to at least partially overlap with an orthographic projection of the third light-emitting sub-unit in the corresponding light-emitting unit on the base substrate; and
the second conductive portion is connected to the fifth light-emitting signal line and extends from the fifth light-emitting signal line toward a side close to a first light-emitting sub-unit in a light-emitting unit corresponding to the second conductive portion, so as to allow an orthographic projection of the second conductive portion on the base substrate to at least partially overlap with an orthographic projection of the first light-emitting sub-unit in the corresponding light-emitting unit on the base substrate.

15. The light-emitting substrate according to claim 12, further comprising a plurality of conductive structures in one-to-one correspondence with the plurality of light-emitting units,
- wherein an orthographic projection of each of the light-emitting units on the base substrate is within a region surrounded by an outer contour of an orthographic projection of a corresponding conductive structure on the base substrate; and
- along a direction from a center to an edge of each of the conductive structures, each conductive structure is divided into a plurality of regions, and light transmittance of each of the regions of the each conductive structure is different from each other.

16. The light-emitting substrate according to claim 15, wherein shapes of orthographic projections of the conductive structures on the base substrate are substantially identical, and the orthographic projections of the conductive structures on the base substrate do not overlap with each other.

17. The light-emitting substrate according to claim 15, wherein along the direction from the center to the edge of each of the conductive structures, the light transmittance of each of the regions of the each conductive structure gradually increases.

18. The light-emitting substrate according to claim 15, wherein each of the conductive structures comprises a first conductive sub-structure and a second conductive sub-structure which are opposite to each other in the column direction;
- the first conductive sub-structure and the second conductive sub-structure are axially symmetric with respect to a center of the conductive structure along the row direction to form the conductive structure;
- the first conductive sub-structure and the second conductive sub-structure are separated and insulated from each other; and
- an orthographic projection of the first conductive sub-structure on the base substrate is on a side of an orthographic projection of the fourth light-emitting signal line on the base substrate away from an orthographic projection of the fifth light-emitting signal line on the base substrate, and an orthographic projection of the second conductive sub-structure on the base substrate is on a side of the orthographic projection of the fifth light-emitting signal line on the base substrate away from the orthographic projection of the fourth light-emitting signal line on the base substrate.

19. The light-emitting substrate according to claim 18, wherein the first conductive sub-structure comprises a plurality of first semi-annular portions arranged in sequence along the direction from the center to the edge of each of the conductive structures, and both ends of each of the first semi-annular portions are respectively connected to the fourth light-emitting signal line, so as to allow two adjacent first semi-annular portions to be electrically connected to each other and form an opening region;
- among the plurality of first semi-annular portions, a distance between two adjacent first semi-annular portions in different regions of each of the conductive structures gradually increases along the direction from the center to the edge of each of the conductive structures;
- the second conductive sub-structure comprises a plurality of second semi-annular portions arranged in sequence along the direction from the center to the edge of each of the conductive structures, and both ends of each of the second semi-annular portions are respectively connected to the fifth light-emitting signal line, so as to allow two adjacent second semi-annular portions to be electrically connected to each other and form an opening region; and
- among the plurality of second semi-annular portions, a distance between two adjacent second semi-annular portions in different regions of each of the conductive structures gradually increases along the direction from the center to the edge of each of the conductive structures.

20. The light-emitting substrate according to claim 1, wherein a distance in the row direction between an orthographic projection of the N-th column of light-emitting units on the base substrate and an orthographic projection of the (N+1)-th column of light-emitting units on the base substrate is greater than 0.

* * * * *